United States Patent
Kim et al.

(10) Patent No.: US 10,923,038 B2
(45) Date of Patent: Feb. 16, 2021

(54) DISPLAY PANEL AND DISPLAY DEVICE

(71) Applicant: LG Display Co., Ltd., Seoul (KR)

(72) Inventors: JaeHyun Kim, Gyeonggi-do (KR);
KyungMo Son, Gyeonggi-do (KR);
Mijin Jeong, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/532,581

(22) Filed: Aug. 6, 2019

(65) Prior Publication Data

US 2020/0152132 A1 May 14, 2020

(30) Foreign Application Priority Data

Nov. 9, 2018 (KR) .................. 10-2018-0137530

(51) Int. Cl.
*G09G 3/3266* (2016.01)
*H01L 27/32* (2006.01)

(52) U.S. Cl.
CPC ....... *G09G 3/3266* (2013.01); *H01L 27/3272* (2013.01); *H01L 27/3276* (2013.01); *G09G 2300/0465* (2013.01)

(58) Field of Classification Search
None
See application file for complete search history.

(56) References Cited

U.S. PATENT DOCUMENTS

| 9,958,738 | B2* | 5/2018 | Chen | G02F 1/134336 |
| 9,978,322 | B2* | 5/2018 | Namkung | G09G 3/3614 |
| 10,410,578 | B2* | 9/2019 | Song | G09G 3/3233 |
| 2001/0015715 | A1* | 8/2001 | Hebiguchi | G09G 3/3677 345/92 |
| 2009/0290081 | A1* | 11/2009 | Cho | G09G 3/3648 349/42 |
| 2013/0201163 | A1* | 8/2013 | Tseng | G02F 1/136286 345/204 |
| 2014/0036191 | A1* | 2/2014 | Zhao | G09G 3/3674 349/46 |
| 2014/0111410 | A1* | 4/2014 | Guo | G09G 3/3614 345/88 |

(Continued)

*Primary Examiner* — Chad M Dicke
(74) *Attorney, Agent, or Firm* — Polsinelli PC

(57) ABSTRACT

A display device comprises a display panel in which a plurality of subpixels are disposed, wherein the plurality of subpixels include a first subpixel, a second subpixel, a third subpixel, and a fourth subpixel that are sequentially disposed in a single row or column; a gate driver disposed on the display panel and supplying a scanning signal to the plurality of subpixels; a first island pattern disposed in each area of the first subpixel and the third subpixel; a second island pattern disposed in each area of the second subpixel and the fourth subpixel; a first connection line electrically connecting the first island pattern disposed in the area of the first subpixel and the first island pattern disposed in the area of the third subpixel; and a second connection line electrically connecting second island pattern disposed in the area of the second subpixel and the second island pattern disposed in the area of the fourth subpixel, wherein the first connection line and the second connection line are electrically disconnected from each other, and the gate driver independently drives the first connection line and the second connection line.

18 Claims, 24 Drawing Sheets

(56) References Cited

U.S. PATENT DOCUMENTS

| | | | |
|---|---|---|---|
| 2015/0041790 A1* | 2/2015 | Lee | H01L 27/3276 257/40 |
| 2016/0063924 A1* | 3/2016 | Oh | H01L 27/1225 345/690 |
| 2016/0131954 A1* | 5/2016 | Li | G09G 3/3614 349/46 |
| 2017/0062546 A1* | 3/2017 | Kim | G09G 3/3233 |
| 2017/0287996 A1* | 10/2017 | Kim | H01L 27/3272 |
| 2017/0301278 A1* | 10/2017 | Sun | G09G 3/20 |
| 2017/0345387 A1* | 11/2017 | Kim | G09G 3/2003 |
| 2017/0345847 A1* | 11/2017 | Kim | H01L 51/5246 |
| 2018/0053478 A1* | 2/2018 | Xu | G09G 3/3677 |
| 2018/0114495 A1* | 4/2018 | Jung | G09G 3/3607 |
| 2018/0137818 A1* | 5/2018 | Kim | G09G 3/2003 |
| 2018/0180960 A1* | 6/2018 | Kubota | G09G 3/3648 |
| 2018/0182319 A1* | 6/2018 | Zha | G09G 3/3677 |
| 2018/0240421 A1* | 8/2018 | Yamazaki | H01L 27/1244 |
| 2018/0261169 A1* | 9/2018 | Du | G09G 3/3607 |
| 2018/0342217 A1* | 11/2018 | Kim | G09G 3/3688 |
| 2019/0081085 A1* | 3/2019 | Ozeki | G02F 1/16766 |
| 2019/0088208 A1* | 3/2019 | Chang | G09G 3/20 |
| 2019/0219878 A1* | 7/2019 | Hao | G02F 1/136286 |
| 2019/0280076 A1* | 9/2019 | Bang | H01L 27/3265 |
| 2019/0304384 A1* | 10/2019 | Hao | G09G 3/3607 |
| 2020/0083309 A1* | 3/2020 | Wang | H01L 27/3276 |
| 2020/0124927 A1* | 4/2020 | Kim | H01L 27/3216 |
| 2020/0135825 A1* | 4/2020 | Cha | H01L 27/3265 |
| 2020/0152132 A1* | 5/2020 | Kim | H01L 27/3272 |
| 2020/0194529 A1* | 6/2020 | Lee | H01L 27/3272 |
| 2020/0194530 A1* | 6/2020 | Lee | H01L 27/3272 |
| 2020/0194536 A1* | 6/2020 | Kim | H01L 27/3262 |

* cited by examiner

Vth Compensation Time Obtainable

DISPLAY PANEL AND DISPLAY DEVICE

CROSS REFERENCE TO RELATED APPLICATION

This application claims priority to Korean Patent Application No. 10-2018-0137530, filed on Nov. 9, 2018 in the Republic of Korea, which is hereby incorporated by reference in its entirety.

BACKGROUND

Field of the Disclosure

The present disclosure relates to a display panel and a display device.

Description of the Background

With the development of the information society, there has been an increasing demand for a range of electronic devices, such as a display device and a lighting device. Such an electronic device may include a panel in which data lines and gate lines are disposed, a data driver driving the data lines, and a gate driver driving the gate lines.

A large number of transistors and signal lines may be disposed in the display panel, a key component of such an electronic device, to drive the display panel. Accordingly, the problem of a reduced aperture ratio of the display panel may be incurred and may be further intensified when the display panel has a larger area or higher resolution.

In addition, when the display panel has a larger area or higher resolution, more time (e.g. charging time or compensation time) may be taken to perform image display driving or sense and compensate for characteristics (e.g. a threshold voltage or mobility) of transistors or the like.

SUMMARY

Various aspects of the present disclosure provide a display panel and a display device having a gate driving structure (or a scanning signal transferring structure) able to increase the aperture ratio of the display panel.

Also provided are a display panel and a display device having a gate driving structure (or a scanning signal transferring structure) able to increase the aperture ratio of the display panel without increasing the size of a non-active area corresponding to a bezel area in a case in which a gate driver has a gate-in-panel (GIP) structure.

Also provided are a display panel and a display device having a gate driving method able to reduce or remove the insufficiency of a charging time or a characteristics compensation time and a gate driving structure (or a scanning signal transferring structure) for the gate driving method.

Also provided are a display panel and a display device having a gate driving method and a gate driving structure (or a scanning signal transferring structure) for the gate driving method, in which the gate driving method can reduce or remove the insufficiency of the charging time or the characteristics compensation time while increasing the aperture ratio of the display panel, even in the case that the display panel has a larger area or higher resolution.

According to an aspect, exemplary aspects may provide a display device including: a display panel in which a plurality of subpixels are arrayed; and a gate driver supplying a scanning signal to the plurality of subpixels.

The plurality of subpixels may include a first subpixel, a second subpixel, a third subpixel, and a fourth subpixel arrayed sequentially in a single row or column.

The display panel may include: a first island pattern disposed in each area of the first subpixel and the third subpixel; a second island pattern disposed in each area of the second subpixel and the fourth subpixel; a first connection line electrically connecting an element of the first island pattern disposed in the area of the first subpixel and an element of the first island pattern disposed in the area of the third subpixel; and a second connection line electrically connecting an element of the second island pattern disposed in the area of the second subpixel and an element of the second island pattern disposed in the area of the fourth subpixel.

The first connection line and the second connection line may be electrically disconnected from each other.

The gate driver may drive the first connection line and the second connection line independently of each other.

The display panel may include an active layer.

In an area in which the first connection line overlaps the active layer, the first connection line may overlap a metal layer located between the first connection line and the active layer.

In an area in which the second connection line overlaps the active layer, the second connection line may overlap the metal layer located between the second connection line and the active layer.

The metal layer may include at least one of a gate material layer including a gate material, of which the first island pattern and the second island pattern are made, or a metal layer different from the gate material layer.

In a case in which the second connection line is located in a layer positioned above the first connection line, the first connection line may be disposed to bypass a contact hole connecting the second connection line and the second island pattern.

In a case in which the first connection line is located in a layer positioned above the second connection line, the second connection line may be disposed to bypass a contact hole connecting the first connection line and the first island pattern.

A portion of the first connection line may be electrically connected to the element of the first island pattern disposed in the area of the first subpixel through a first contact hole, and another portion of the first connection line may be electrically connected to the element of the first island pattern disposed in the area of the third subpixel through another first contact hole.

A portion of the second connection line may be electrically connected to the element of the second island pattern disposed in the area of the second subpixel through a second contact hole, and another portion of the second connection line may be electrically connected to the element of the second island pattern disposed in the area of the fourth subpixel through another second contact hole.

The number of layers, through which each of the first contact holes extends, may be different from the number of layers, through which each of the second contact holes extends.

A distance between a layer in which the first connection line is located and a layer in which the first island pattern is located may be shorter than a distance between a layer in which the second connection line is located and a layer in which the second island pattern is located.

The first connection line may be disposed to bypass the second contact holes.

The first island pattern and the second island pattern may be located in a single layer.

The layer in which the first island pattern and the second island pattern are located may be positioned above an active layer, the layer in which the first connection line is located may be positioned above the layer in which the first island pattern and the second island pattern are located, and the layer in which the second connection line is located may be positioned above the layer in which the first connection line is located.

The first island pattern and the second island pattern may be located in different layers.

An active layer may be located between the layer in which the first island pattern is located and the layer in which the second island pattern is located.

The layer in which the first island pattern is located may be positioned below the active layer, the layer in which the first connection line is located may be positioned below the layer in which the first island pattern is located, the layer in which the second island pattern is located may be positioned above the active layer, and the layer in which the second connection line is located may be positioned above the layer in which the second island pattern is located.

Each of the plurality of subpixels may include a scanning transistor. The scanning transistors, included in odd-numbered subpixels, among the plurality of subpixels, including the first subpixel and the third subpixel, may operate independently of the scanning transistors included in even-numbered subpixels, among the plurality of subpixels, including the second subpixel and the fourth subpixel.

Each of the plurality of subpixels may include: one or more first type transistors performing on-off operations in response to a first type gate signal corresponding to the scanning signal; and one or more second type transistors performing on-off operations in response to a second type gate signal corresponding to an emission control signal.

The one or more first type transistors, included in odd-numbered subpixels, among the plurality of subpixels, including the first subpixel and the third subpixel, may operate independently of the one or more first type transistors included in even-numbered subpixels, among the plurality of subpixels, including the second subpixel and the fourth subpixel. The one or more second type transistors, included in the odd-numbered subpixels including the first subpixel and the third subpixel, may operate independently of the one or more second type transistors included in the even-numbered subpixels including the second subpixel and the fourth subpixel.

Alternatively, the one or more first type transistors, included in odd-numbered subpixels, among the plurality of subpixels, including the first subpixel and the third subpixel, may operate independently of the one or more first type transistors included in even-numbered subpixels, among the plurality of subpixels, including the second subpixel and the fourth subpixel. The one or more second type transistors, included in the odd-numbered subpixels including the first subpixel and the third subpixel, may operate in the same manner as the one or more second type transistors included in the even-numbered subpixels including the second subpixel and the fourth subpixel.

According to another aspect, exemplary aspects may provide a display panel including: a first subpixel, a second subpixel, a third subpixel, and a fourth subpixel arrayed sequentially in a single row or column; a first scanning signal transferring line, through which a first scanning signal is transferred to the first subpixel and the third subpixel; and a second scanning signal transferring line, through which a second scanning signal is transferred to the second subpixel and the fourth subpixel.

The first scanning signal transferring line and the second scanning signal transferring line may be disposed in different layers.

The first scanning signal transferring line may include: a first island pattern disposed in each area of the first subpixel and the third subpixel; and a first connection line electrically connecting an element of the first island pattern disposed in the area of the first subpixel and an element of the first island pattern disposed in the area of the third subpixel.

The second scanning signal transferring line may include: a second island pattern disposed in each area of the second subpixel and the fourth subpixel; a second connection line electrically connecting an element of the second island pattern disposed in the area of the second subpixel and an element of the second island pattern disposed in the area of the fourth subpixel.

The first connection line and the second connection line may be electrically disconnected from each other.

According to exemplary aspects, the display panel and the display device may have a gate driving structure (or a scanning signal transferring structure) able to increase the aperture ratio of the display panel.

According to exemplary aspects, the display panel and the display device may have a gate driving structure (or a scanning signal transferring structure) able to increase the aperture ratio of the display panel without increasing the size of a non-active area corresponding to a bezel area in a case in which the gate driver has a GIP structure.

According to exemplary aspects, the display panel and the display device may have a gate driving method able to reduce or remove the insufficiency of a charging time or a characteristics compensation time and a gate driving structure (or a scanning signal transferring structure) for the gate driving method.

According to exemplary aspects, the display panel and the display device may have a gate driving method and a gate driving structure (or a scanning signal transferring structure) for the gate driving method, in which the gate driving method can reduce or remove the insufficiency of the charging time or the characteristics compensation time while increasing the aperture ratio of the display panel, even in the case that the display panel has a larger area or higher resolution.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION

Figure 1:
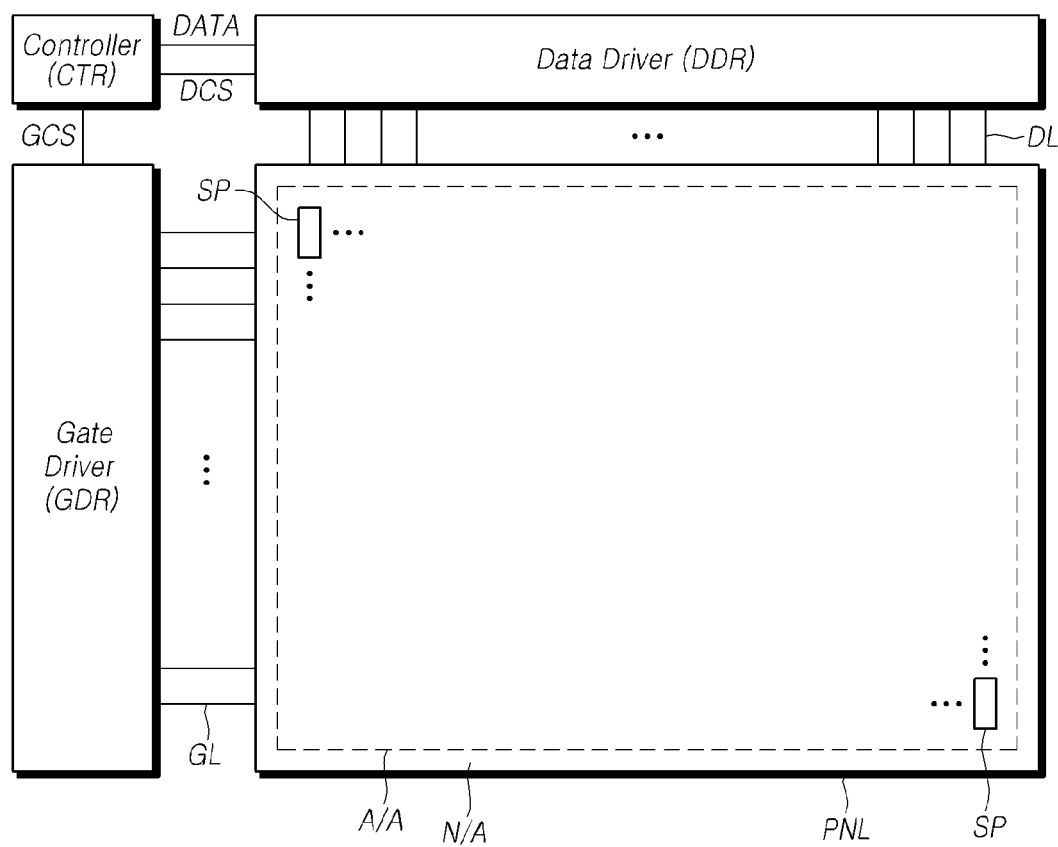
FIG. 1 illustrates a schematic configuration of a display device according to exemplary aspects of the present disclosure.

The advantages and features of the present disclosure and methods of the realization thereof will be apparent with reference to the accompanying drawings and detailed descriptions of the aspects. The present disclosure should not be construed as being limited to the aspects set forth herein and may be embodied in many different forms. Rather, these aspects are provided so that the present disclosure will be thorough and complete, and will fully convey the scope of the present disclosure to a person having ordinary skill in the art. The scope of the present disclosure shall be defined by the appended Claims.

The shapes, sizes, ratios, angles, numbers, and the like, inscribed in the drawings to illustrate exemplary aspects are illustrative only, and the present disclosure is not limited to the aspects illustrated in the drawings. Throughout this document, the same reference numerals and symbols will be used to designate the same or like components. In the following description of the present disclosure, detailed descriptions of known functions and components incorporated into the present disclosure will be omitted in the case in which the subject matter of the present disclosure may be rendered unclear thereby. It will be understood that the terms "comprise," "include," "have," and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the case in which there is no explicit description thereof.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element. In the same context, it will be understood that when an element is referred to as being formed "on," "above," "under," or "next to" another element, not only can it be directly located on or under the other element, but it can also be indirectly located on or under the other element via an intervening element.

In addition, terms, such as "first" and "second" may be used herein to describe a variety of components. It should be understood, however, that these components are not limited by these terms. These terms are merely used to discriminate one element or component from other elements or components. Thus, a first element referred to as first hereinafter may be a second element within the spirit of the present disclosure.

The features (or components) of exemplary aspects of the present disclosure may be partially or entirely coupled or combined with each other and may work in concert with each other or may operate in a variety of technical methods. In addition, respective exemplary aspects may be carried out independently or may be associated with and carried out in concert with other aspects.

Hereinafter, exemplary aspects will be described in detail with reference to the accompanying drawings.

FIG. 1 illustrates a schematic configuration of a display device according to exemplary aspects.

The display device according to exemplary aspects may include an electric device for displaying images, information, and the like, a lighting device, a light-emitting device, and the like. The following description will mainly be focused on the display device for the sake of brevity.

The display device according to exemplary aspects may include a display panel PNL displaying images or emitting light and a driver circuit driving the display panel PNL.

In the display panel PNL, a plurality of data lines DL and a plurality of gate lines GL may be disposed, and a plurality of subpixels SP, defined by intersections of the plurality of gate lines and the plurality of data lines, may be arrayed in the form of a matrix.

In the display panel PNL, the plurality of data lines DL and the plurality of gate lines GL may be disposed to intersect each other. For example, the plurality of gate lines GL may be arrayed in rows or columns, while the plurality of data lines DL may be arrayed in columns or rows. Hereinafter, the plurality of gate lines GL will be described as being arrayed in rows, while the plurality of data lines DL will be described as being arrayed in columns, for the sake of brevity.

Various signal lines, other than the plurality of data lines DL and the plurality of gate lines GL, may be disposed in the display panel PNL, depending on the subpixel structure or the like. Driving voltage lines, reference voltage lines, common voltage lines, and the like may be further disposed.

The display panel PNL may be one of various types of panels, such as a liquid crystal display (LCD) panel and an organic light-emitting diode (OLED) panel.

Types of signal lines disposed in the display panel PNL may vary depending on the subpixel structure, the display panel type (e.g. an LCD panel or an OLED panel), or the like. In addition, the term "signal lines" used herein may be a concept including electrodes to which signals are applied.

The display panel PNL may include an active area A/A in which images are displayed and a non-active area N/A in which no images are displayed, the non-active area N/A being located in the periphery of the active area A/A. Herein, the non-active area N/A is also referred to as a bezel area.

The plurality of subpixels SP displaying images is disposed in the active area A/A.

A pad assembly may be disposed in the non-active area N/A, with a data driver DDR being electrically connected to the pad assembly. A plurality of data link lines connecting the pad assembly and the plurality of data lines DL may be disposed in the non-active area N/A. Herein, the plurality of data link lines may be extensions of the plurality of data lines DL into the non-active area N/A or separate patterns electrically connected to the plurality of data lines DL.

In addition, gate driving-related lines may be disposed in the non-active area N/A to transfer voltages (or signals) necessary for gate driving to a gate driver GDR via the pad assembly to which the gate driver GDR is electrically connected. For example, the gate driving-related lines may include clock lines, through which clock signals are transferred, gate voltage lines, through which gate voltages VGH and VGL are transferred, gate driving control signal lines, through which a variety of control signals necessary for the generation of a scanning signal (or gate signal) are transferred, and the like. These gate driving-related lines are disposed in the non-active area N/A, unlike the gate lines GL disposed in the active area A/A.

The driver circuit driving the display panel PNL may include the data driver DDR driving the plurality of data lines DL, the gate driver GDR driving the plurality of gate lines GL, a controller CTR controlling the data driver DDR and the gate driver GDR, and the like.

The data driver DDR may drive the plurality of data lines DL by outputting a data voltage to the plurality of data lines DL.

The gate driver GDR may drive the plurality of gate lines GL by outputting a scanning signal to the plurality of gate lines GL. Herein, the scanning signal may also be referred to as a gate signal.

The controller CTR may control the driving operations of the data driver DDR and the gate driver GDR by supplying a variety of control signals DCS and GCS necessary for the driving operations of the data driver DDR and the gate driver GDR. In addition, the controller CTR may supply image data DATA to the data driver DDR.

The controller CTR starts scanning at points in time realized by respective frames, converts image data input from an external source into image data DATA having a data signal format readable by the data driver DDR, outputs the converted image data DATA, and controls data driving at appropriate points in time according to the scanning.

The controller CTR receives timing signals, including a vertical synchronization signal Vsync, a horizontal synchronization signal Hsync, an input data enable (DE) signal, a clock (CLK) signal, and the like, from an external source (e.g. a host system), generates a variety of control signals, and outputs the variety of control signals to the data driver DDR and the gate driver GDR in order to control the data driver DDR and the gate driver GDR.

For example, the controller CTR outputs a variety of gate control signals GCS, including a gate start pulse (GSP) signal, a gate shift clock (GSC) signal, a gate output enable (GOE) signal, and the like, to control the gate driver GDR.

In addition, the controller CTR outputs a variety of data control signals DCS, including a source start pulse (SSP) signal, a source sampling clock (SSC) signal, a source output enable (SOE) signal, and the like, to control the data driver DDR.

The controller CTR may be a timing controller used in a typical display device, or may be a control device including a timing controller and performing other control functions.

The controller CTR may be provided as a component separate from the data driver DDR, or may be provided as an integrated circuit (IC) combined (or integrated) with the data driver DDR.

The data driver DDR receives image data DATA from the controller CTR and supplies a data voltage to the plurality of data lines DL to drive the plurality of data lines DL. The data driver DDR may also be referred to as a source driver.

The data driver DDR may send and receive a variety of signals to and from the controller CTR via a variety of interfaces.

The gate driver GDR sequentially drives the plurality of gate lines GL by sequentially supplying a scanning signal to the plurality of gate lines GL. Herein, the gate driver GDR may also be referred to as a scan driver.

The gate driver GDR sequentially supplies the scanning signal having an on or off voltage to the plurality of gate lines GL, under the control of the controller CTR.

If a specific gate line is opened by the gate driver GDR, the data driver DDR converts the image data DATA, received from the controller CTR, into an analog data voltage, and supplies the data voltage to the plurality of data lines DL.

The data driver DDR may be disposed on one side of the display panel PNL (e.g. above or below the display panel PNL). In some cases, the data driver DDR may be disposed on both sides of the display panel PNL (e.g. above and below the display panel PNL), depending on the driving system, the design of the display panel, or the like.

The gate driver GDR may be disposed on one side of the display panel PNL (e.g. to the right or left of the display panel PNL). In some cases, the gate driver GDR may be disposed on both sides of the display panel PNL (e.g. to the right and left of the display panel PNL), depending on the driving system, the design of the display panel, or the like.

The data driver DDR may include one or more source driver ICs (SDICs).

Each of the source driver ICs may include a shift register, a latch circuit, a digital-to-analog converter (DAC), an output buffer, and the like. In some cases, the data driver DDR may further include one or more analog-to-digital converters (ADCs).

Each of the source driver ICs may be connected to a bonding pad of the display panel PNL by a tape-automated bonding (TAB) method or by a chip-on-glass (COG) method, or may directly mounted on the display panel PNL. In some cases, each of the source driver ICs may be integrated with the display panel PNL. In addition, each of the source driver ICs may be implemented using a chip-on-film (COF) structure. In this case, each of the source driver ICs may be mounted on a circuit film to be electrically connected to the data lines DL in the display panel PNL via the circuit film.

The gate driver GDR may include a plurality of gate driver circuits (GDCs). Herein, the plurality of gate driver circuits may correspond to the plurality of gate lines GL, respectively.

Each of the gate driver circuits may include a shift register, a level register, and the like.

Each of the gate driver circuits may be connected to a bonding pad of the display panel PNL by TAB or by a COG method. In addition, each of the gate driver circuits may be implemented using a COF structure. In this case, each of the gate driver circuits may be mounted on a circuit film to be electrically connected to the gate lines GL in the display panel PNL via the circuit film. In addition, each of the gate driver circuits may be implemented using gate-in-panel (GIP) structure disposed within the display panel PNL. That is, each of the gate driver circuits may be directly provided in the display panel PNL.

Figure 2:
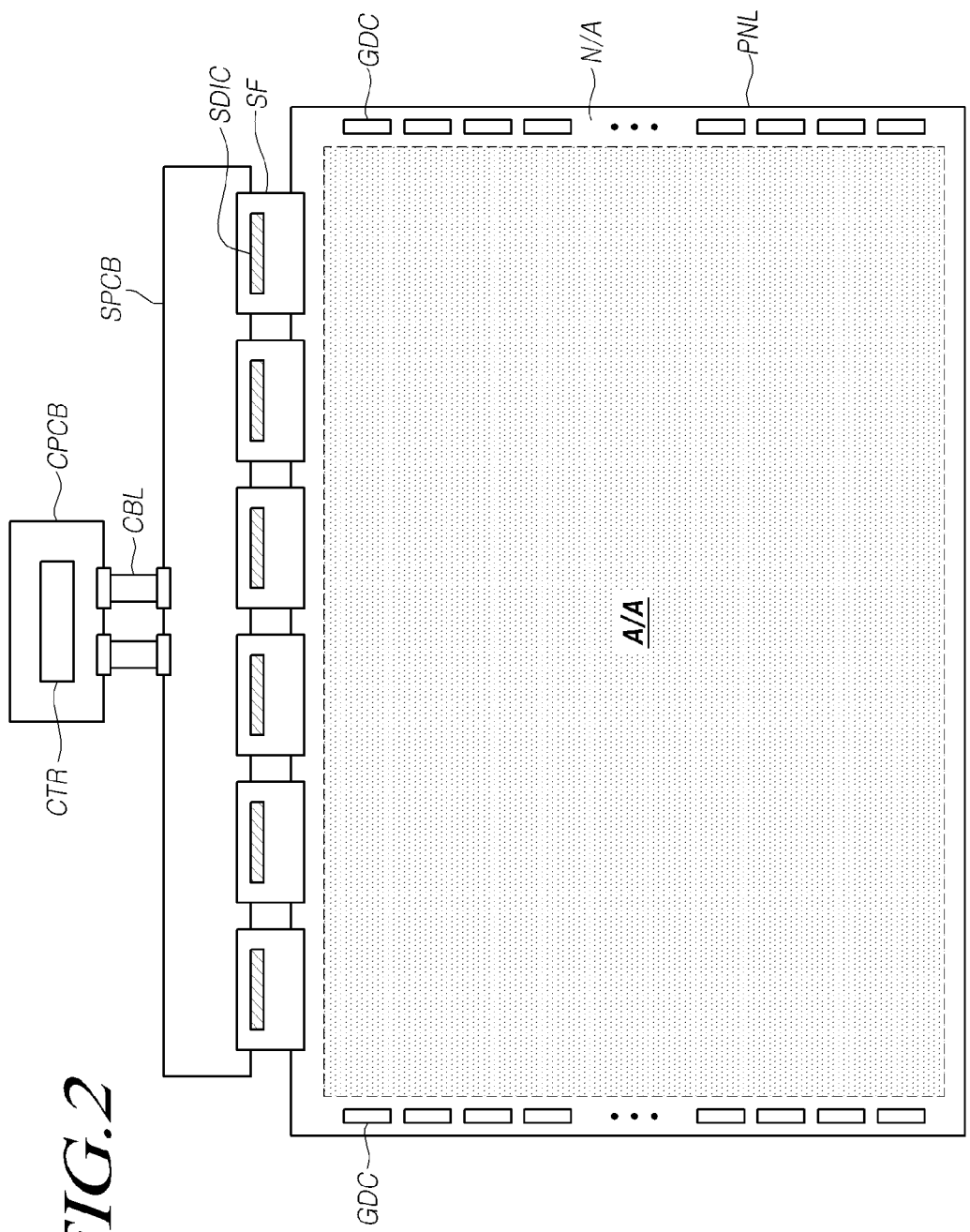
FIG. 2 illustrates a system of the display device according to exemplary aspects.

FIG. 2 illustrates a system of the display device according to exemplary aspects.

Referring to FIG. 2, in the display device according to exemplary aspects, the data driver DDR may be implemented using a COF structure among a plurality of structures, such as a TAB structure, a COG structure, and a COF structure, while the gate driver GDR may be implemented using a GIP structure among a variety of structures, such as a TAB structure, a COG structure, a COF structure, and a GIP structure.

The data driver DDR may be comprised of one or more source driver ICs SDIC. In FIG. 2, the data driver DDR is illustrated as being comprised of a plurality source driver ICs SDIC.

In a case in which the data driver DDR has the COF structure, each of the source driver ICs SDIC of the data driver DDR may be mounted on a corresponding one of source-side circuit films SF.

One portion of each of the source-side circuit films SF may be electrically connected to the pad assembly (i.e. an assembly of pads) present in the non-active area N/A of the display panel PNL.

Lines, electrically connecting the source driver ICs SDIC and the display panel PNL, may be disposed on the source-side circuit films SF.

The display device may include at least one source printed circuit board SPCB and a control printed circuit board CPCB, on which control components and a variety of electric devices are mounted, in order to connect the plurality of source driver ICs SDIC to the circuits of the other devices.

The other portion of each of the source-side circuit films SF, on which the source driver IC SDICs are mounted, may be connected to the at least one source printed circuit board SPCB.

That is, one portion of each of the source-side circuit films SF, on which the source driver ICs SDIC are mounted, may be electrically connected to the non-active area N/A of the display panel PNL, while the other portion of each of the source-side circuit films SF may be electrically connected to the source printed circuit board SPCB.

The controller CTR, controlling the operation of the data driver DDR, the gate driver GDR, and the like, may be disposed in the control printed circuit board CPCB.

In addition, a power management IC (PMIC) and the like may be disposed on the control printed circuit board CPCB. The power management IC supplies various forms of voltage or current to the display panel PNL, the data driver DDR, the gate driver GDR, and the like, or controls various forms of voltage or current to be supplied to the same.

The source printed circuit board SPCB and the control printed circuit board CPCB may be connected to each other via at least one connector CBL. The connector CBL may be, for example, a flexible printed circuit (FPC), a flexible flat cable (FFC), or the like.

The at least one source printed circuit board SPCB and the control printed circuit board CPCB may be integrated (or combined) into a single printed circuit board.

In a case in which the gate driver GDR is implemented using a GIP structure, a plurality of gate driver circuits GDC of the gate driver GDR may be directly disposed on the non-active area N/A of the display panel PNL.

Each of the plurality of gate driver circuits GDC may output a scanning signal SCAN to a corresponding gate line GL, among the plurality of gate lines GL, disposed in the active area A/A of the display panel PNL.

The plurality of gate driver circuits GDC disposed on the display panel PNL may be supplied with a variety of signals (e.g. a clock signal, a high-level gate voltage VGH, a low-level gate voltage VGL, a start signal VST, a reset signal RST, and the like), necessary for the generation of the scanning signal, through the gate driving-related lines disposed in the non-active area N/A.

The gate driving-related lines disposed in the non-active area N/A may be electrically connected to some source-side circuit films SF, among the source-side circuit films SF, disposed closest to the plurality of gate driver circuits GDC.

Figure 3:
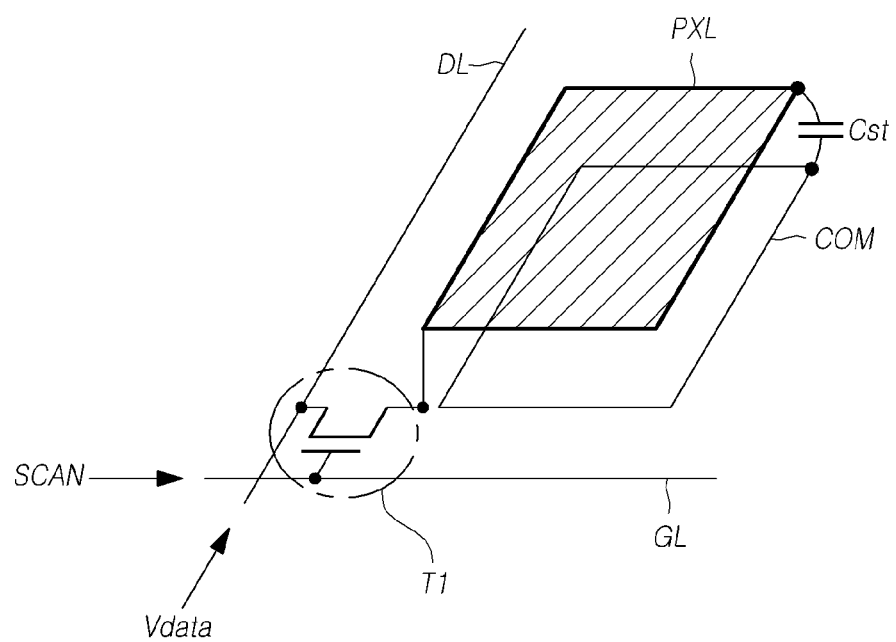
FIG. 3 illustrates a subpixel structure in the display panel according to exemplary aspects in a case in which the display panel is a liquid crystal display (LCD) panel.

FIG. 3 illustrates a structure of a subpixel SP in the display panel PNL according to exemplary aspects in a case in which the display panel PNL is a liquid crystal display (LCD) panel.

Referring to FIG. 3, each of the subpixels SP in the LCD display panel PNL may include a pixel electrode PXL, a first transistor T1, and the like.

The first transistor T1 may be controlled by a scanning signal SCAN, and may be electrically connected between a data line DL and the pixel electrode PXL.

The first transistor T1 is turned on by the scanning signal SCAN to transfer a data voltage Vdata, supplied from the data line DL, to the pixel electrode PXL. The pixel electrode PXL, to which the data voltage Vdata is applied, may generate an electric field together with a common electrode COM to which a common voltage is applied. That is, a capacitor Cst may be generated between the pixel electrode PXL and the common electrode COM.

The first transistor T1 is a scanning transistor.

The subpixel structure illustrated in FIG. 3 may be a 1T1C structure comprised of a single transistor T1 and a single capacitor Cst.

The subpixel structure illustrated in FIG. 3 is merely for the sake of brevity, but the subpixel structure in the LCD display panel may further include one or more transistors or one or more capacitors, in addition to the 1T1C structure.

Figure 4:
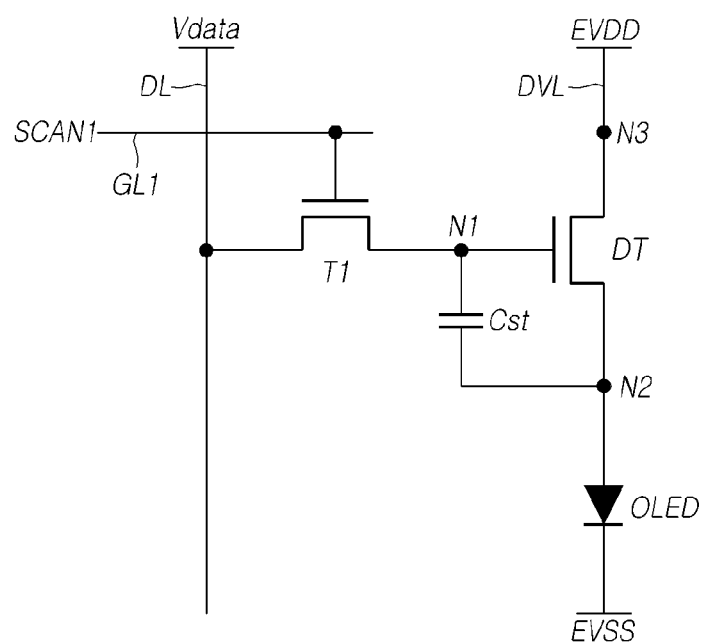
FIGS. 4, 5, and 6 illustrate subpixel structures in the display panel according to exemplary aspects in a case in which the display panel is an organic light emitting diode (OLED) display panel.
Figure 5:
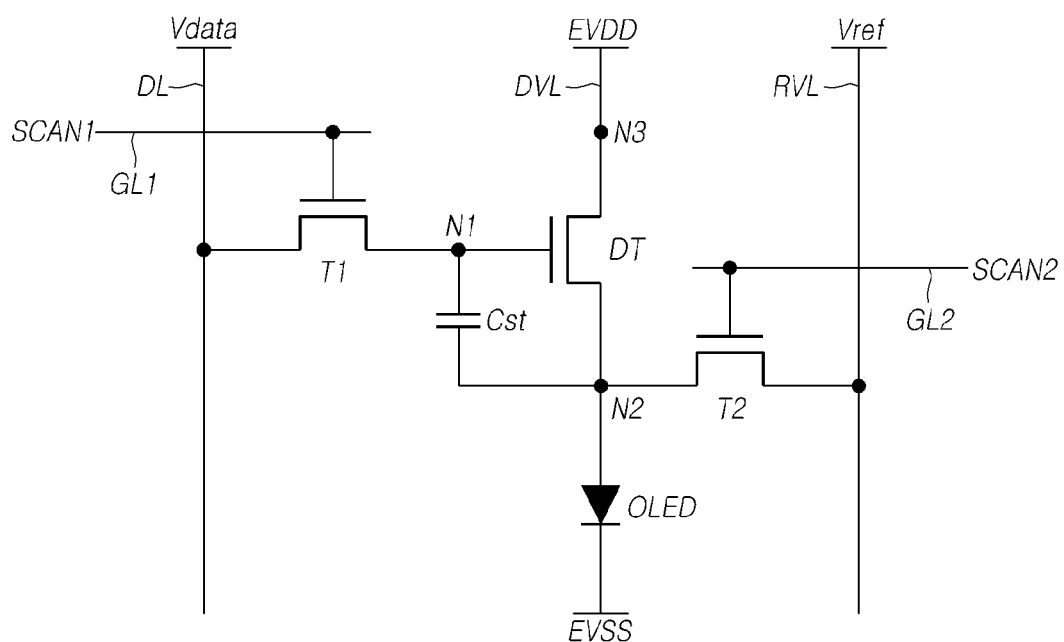
Figure 6:
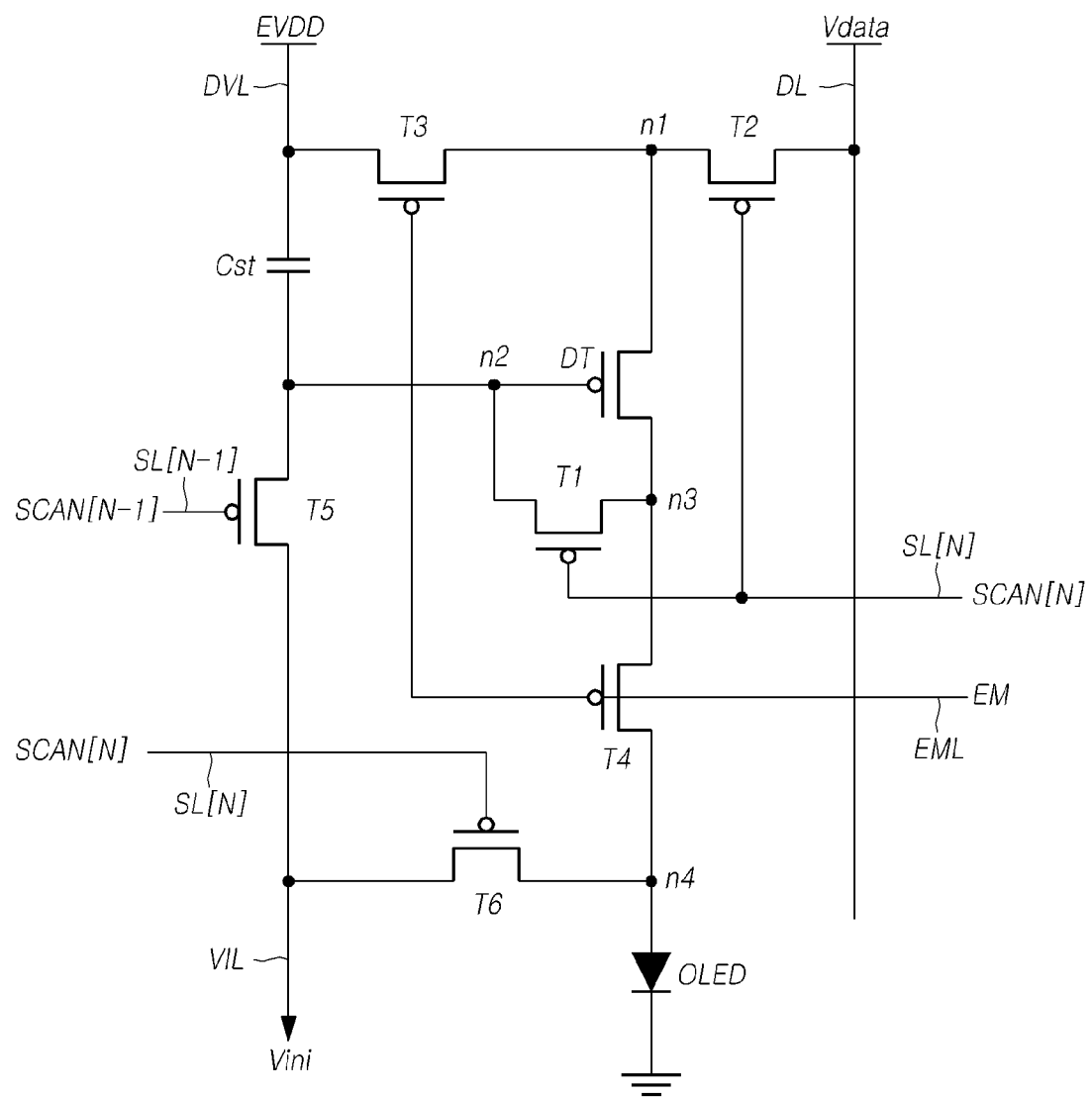

FIGS. 4, 5, and 6 illustrate subpixel structures in the display panel PNL according to exemplary aspects in a case in which the display panel PNL is an organic light emitting diode (OLED) display panel.

The subpixel structure in the display panel PNL may have a 2T1C structure comprised of two transistors DT and T1 and a single capacitor Cst as illustrated in FIG. 4, a 3T1C structure comprised of three transistors DT, T1, and T2 and a single capacitor Cst as illustrated in FIG. 5, or a 7T1C structure comprised of seven transistors DT, T1, T2, T3, T4, T5, and T6 and a single capacitor Cst as illustrated in FIG. 6.

Referring to FIG. 4, the subpixel SP having the 2T1C structure may include an organic light-emitting diode OLED, a driving transistor DT driving the organic light-emitting diode OLED, a first transistor T1 electrically connected between a first node N1 of the driving transistor DT and a corresponding data line DL, a storage capacitor Cst electrically connected between the first node N1 and a second node N2 of the driving transistor DT, and the like.

The organic light-emitting diode OLED emits light in response to driving current supplied from the driving transistor DT.

The organic light-emitting diode OLED may include an anode, an organic light-emitting layer, a cathode, and the like.

Referring to the circuit illustrated in FIG. 3, the anode (also referred to as a pixel electrode) of the organic light-emitting diode OLED may be electrically connected to the second node N2 of the driving transistor DT. A base voltage EVSS may be applied to the cathode (also referred to as a common electrode) of the organic light-emitting diode OLED.

Here, the base voltage EVSS may be, for example, a ground voltage or a voltage higher or lower than the ground voltage. In addition, the base voltage EVSS may vary, depending on the driving state. For example, the base voltage EVSS, during image display driving, and the base voltage EVSS, during sensing driving, may be set differently.

A multilayer organic compound layer may be present between the anode and the cathode of the organic light-emitting diode OLED. The organic compound layer may include a hole transport region, an electron transport region, and a light-emitting layer. The hole transport region is a layer through which holes are injected into or transported to the light-emitting layer. The hole transport region may include, for example, a hole injection layer (HIL), a hole transport layer (HTL), an electron blocking layer (EBL), and the like. The electron transport region is a layer through which electrons are injected into or transported to the light-emitting layer. The electron transport region may include, for example, an electron transport layer (ETL), an electron injection layer (EIL), a hole blocking layer (HBL), and the like.

The driving transistor DT drives the organic light-emitting diode OLED by supplying a driving current to the organic light-emitting diode OLED.

The driving transistor DT may include the first node N1, the second node N2, a third node N3, and the like.

The first node N1 of the driving transistor DT may be a gate node, and may be electrically connected to a source node or a drain node of the first transistor T1. The second node N2 of the driving transistor DT may be a source node or a drain node, and may be electrically connected to an anode (or a cathode) of the organic light-emitting diode OLED. The third node N3 of the driving transistor DT may be a drain node or a source node, to which a driving voltage EVDD may be applied. The third node N3 may be electrically connected to a driving voltage line DVL, through which the driving voltage EVDD is supplied.

The storage capacitor Cst may be electrically connected between the first node N1 and the second node N2 of the driving transistor DT to maintain a data voltage Vdata corresponding to an image signal voltage or a voltage corresponding to the data voltage Vdata during a one-frame period (or a predetermined period).

The drain node or source node of the first transistor T1 may be electrically connected to the corresponding data line DL. The source node or drain node of the first transistor T1 may be electrically connected to the first node N1 of the driving transistor DT. The gate node of the first transistor T1 may be electrically connected to a first gate line GL1, through which a first scanning signal SCAN1 may be applied thereto.

The first transistor T1 may be on-off controlled by the first scanning signal SCAN1 applied to the gate node thereof through the first gate line GL1.

The first transistor T1 is a scanning transistor.

The first transistor T1 may be turned on by the first scanning signal SCAN1 to transfer the data voltage Vdata, supplied from the corresponding data line DL, to the first node N1 of the driving transistor DT.

In addition, the storage capacitor Cst may be an external capacitor intentionally designed to be disposed externally of the driving transistor DT, rather than a parasitic capacitor (e.g. Cgs or Cgd), i.e. an internal capacitor present between the first node N1 and the second node N2 of the driving transistor DT.

Each of the driving transistor DT and the first transistor T1 may be an n-type transistor or a p-type transistor.

Referring to FIG. 5, the 3T1C subpixel structure may further include a second transistor T2 electrically connected between the second node N2 of the driving transistor DT and a reference voltage line RVL, in addition to the subpixel structure (i.e. 2T1C structure) illustrated in FIG. 4. Here, the reference voltage line RVL is a signal line through which a reference voltage Vref is transferred.

The second transistor T2 is a scanning transistor.

A drain node or a source node of the second transistor T2 may be electrically connected to the corresponding reference voltage line RVL. The source node or the drain node of the second transistor T2 may be electrically connected to the second node N2 of the driving transistor DT. A gate node of the second transistor T2 may be electrically connected to a second gate line GL2, through which a second scanning signal SCAN2 may be applied thereto.

The second transistor T2 may be on-off controlled by the second scanning signal SCAN2 applied to the gate node thereof through the second gate line GL2.

The second transistor T2 may be turned on by the second scanning signal SCAN2 according to intended driving timing to transfer the reference voltage Vref, supplied from the corresponding reference voltage line RVL, to the second node N2 of the driving transistor DT.

The second transistor T2 may be a transistor used to detect characteristics (e.g. a threshold voltage or mobility) of the driving transistor DT or characteristics (e.g. a threshold voltage) of the organic light-emitting diode OLED.

The second transistor T2 may be turned on according to sensing timing, allowing a sensor (not shown, e.g. an analog-to-digital converter), which may be electrically connected to the reference voltage line RVL, to measure a voltage of the second node N2 of the driving transistor DT through the reference voltage line RVL.

The first gate line GL1, connected to the gate node of the first transistor T1, and the second gate line GL2, connected to the gate node of the second transistor T2, may be different gate lines or the same gate line. That is, the first scanning signal SCAN1, applied to the gate node of the first transistor T1, and the second scanning signal SCAN2, applied to the gate node of the second transistor T2, may be different scanning signals or the same scanning signal.

Each of the driving transistor DT, the first transistor T1, and the second transistor T2 may be an n-type transistor or a p-type transistor.

Referring to FIG. 6, the subpixel SP having the 7T1C structure may include the organic light-emitting diode OLED, the driving transistor DT, the first to sixth transistors T1 to T6, and the capacitor Cst.

The organic light-emitting diode OLED emits light in response to driving current supplied from the driving transistor DT. The anode of the organic light-emitting diode OLED may be electrically connected to a fourth node n4, and a cathode of the organic light-emitting diode OLED may be electrically connected to an input end of a base voltage EVSS, corresponding to a low-potential driving voltage.

The driving transistor DT controls the driving voltage applied to the organic light-emitting diode OLED, depending on a gate-source voltage Vgs. The driving transistor DT may be, for example, a p-type transistor. In this case, the source electrode of the driving transistor DT may be connected to the first node n1, the gate electrode of the driving transistor DT may be connected to a second node n2, and the drain electrode of the driving transistor DT may be connected to a third node n3.

The first transistor T1 may be electrically connected between the second node n2 and the third node n3. That is, the first transistor T1 may be electrically connected between the gate electrode and the drain electrode of the driving transistor DT.

The drain electrode or source electrode of the first transistor T1 may be electrically connected to the second node n2, and the source electrode or drain electrode of the first transistor T1 may be electrically connected to the third node n3. The gate electrode of the first transistor T1 may be electrically connected to an nth scanning line SL[N].

The first transistor T1 may electrically connect the gate electrode and the drain electrode of the driving transistor DT, in response to an nth scanning signal SCAN[N] applied thereto through the nth scanning line SL[N]. Here, the electrical connection between the gate electrode and the drain electrode of the driving transistor DT may be referred to as diode connection.

The second transistor T2 may be electrically connected between the data line DL and the first node n1. That is, the second transistor T2 may be electrically connected to the data line DL and the source electrode of the driving transistor DT.

The drain electrode or the source electrode of the second transistor T2 may be electrically connected to the first node n1, and the source electrode or the drain electrode of the second transistor T2 may be electrically connected to data line DL. The gate electrode of the second transistor T2 may be electrically connected to the nth scanning line SL[N].

The second transistor T2 may transfer the data voltage Vdata, supplied from the data line DL, to the first node n1, in response to the nth scanning signal SCAN[N] applied thereto through the nth scanning line SL[N].

The gate electrode of the first transistor T1 and the gate electrode of the second transistor T2 may be commonly connected to the same nth scanning line SL[N]. Thus, the first transistor T1 and the second transistor T2 may be simultaneously turned on and off.

The third transistor T3 may be electrically connected between the driving voltage line DVL and the first node n1. That is, the third transistor T3 may be electrically connected between the driving voltage line DVL and the source electrode of the driving transistor DT.

The source electrode or the drain electrode of the third transistor T3 may be electrically connected to the driving voltage line DVL, and the drain electrode or the source electrode of the third transistor T3 may be electrically connected to the first node n1. The gate electrode of the third transistor T3 may be electrically connected to an emission control line EML.

The third transistor T3 may transfer a high-potential driving voltage EVDD to the first node n1, in response to an emission control signal EM applied thereto through the emission control line EML.

The fourth transistor T4 may be electrically connected between the third node n3 and the fourth node n4. That is, the fourth transistor T4 may be electrically connected between the drain electrode of the driving transistor DT and the anode of the organic light-emitting diode OLED.

The source electrode or the drain electrode of the fourth transistor T4 may be electrically connected to the third node n3, and the drain electrode or the source electrode of the fourth transistor T4 may be electrically connected to the fourth node n4. The gate electrode of the fourth transistor T4 may be electrically connected to the emission control line EML.

The fourth transistor T4 forms a current path between the third node n3 and the fourth node n4, in response to the emission control signal EM applied thereto through the emission control line EML.

The gate electrode of the third transistor T3 and the gate electrode of the fourth transistor T4 may be commonly connected to the same emission control line EML. Thus, the third transistor T3 and the fourth transistor T4 may be simultaneously turned on and off.

The fifth transistor T5 may be electrically connected between the second node n2 and an initialization voltage line VIL. That is, the fifth transistor T5 may be electrically connected between the gate electrode of the driving transistor DT and the initialization voltage line VIL.

The source electrode or the drain electrode of the fifth transistor T5 may be electrically connected to the initialization voltage line VIL, and the drain electrode or the source electrode of the fifth transistor T5 may be electrically connected to the second node n2. The gate electrode of the fifth transistor T5 may be electrically connected to an (n−1)th scanning line SL[N−1].

The fifth transistor T5 may transfer an initialization voltage Vini to the second node n2, in response to an (n−1)th scanning signal SCAN[N−1] applied thereto through the (n−1)th scanning line SL[N−1].

The sixth transistor T6 may be electrically connected between the initialization voltage line VIL and the fourth node n4. That is, the sixth transistor T6 may be electrically connected between the initialization voltage line VIL and the anode of the organic light-emitting diode OLED.

The source electrode or the drain electrode of the sixth transistor T6 may be electrically connected to the initialization voltage line VIL, and the drain electrode or the source electrode of the sixth transistor T6 may be electrically connected to the fourth node n4. The gate electrode of the sixth transistor T6 may be electrically connected to the nth scanning line SL[N].

The sixth transistor T6 may transfer the initialization voltage Vini to the fourth node n4, in response to the nth scanning signal SCAN[N] applied thereto through the nth scanning line SL[N].

Each of the first to sixth transistors T1 to T6 is a scanning transistor.

The storage capacitor Cst may include a first plate electrically connected to the second node n2 and a second plate electrically connected to the driving voltage line DVL.

Although all of the seven transistors DT and T1 to T6 have been illustrated as being p-type transistors in FIG. 6, this is merely for the sake of brevity. Rather, all of the seven transistors DT and T1 to T6 may be n-type transistors, or some of the seven transistors DT and T1 to T6 may be p-type transistors while the remaining transistors may be n-type transistors.

In the illustration of FIG. 6, the nth scanning line SL[N], the (n−1)th scanning line SL[N−1], and the emission control line EML correspond to gate lines GL. The emission control signal EM corresponds to a scanning signal (or gate signal).

In other words, the nth scanning signal SCAN[N] and the (n−1)th scanning signal SCAN[N−1] may be referred to as first type gate signals (or first type scanning signals), and the emission control signal EM may be referred to as a second type gate signal.

Therefore, the transistors T1, T2, T5, and T6 receiving first type gate signals may be referred to as first type transistors, while the transistors T3 and T4 receiving the second type gate signals may be referred to as second type transistors.

The subpixel structures illustrated in FIGS. 4 to 6 are only for illustrative purposes. Each of the subpixel structures may be modified to have various other shapes (e.g. 4T1C, 4T2C, 6T1C, 6T2C, 8T1C) including two or more transistors and one or more capacitors. In addition, each of the plurality of subpixels may have the same structure, or some subpixels among the plurality of subpixels may have a different structure from that of the remaining subpixels.

Figure 7:
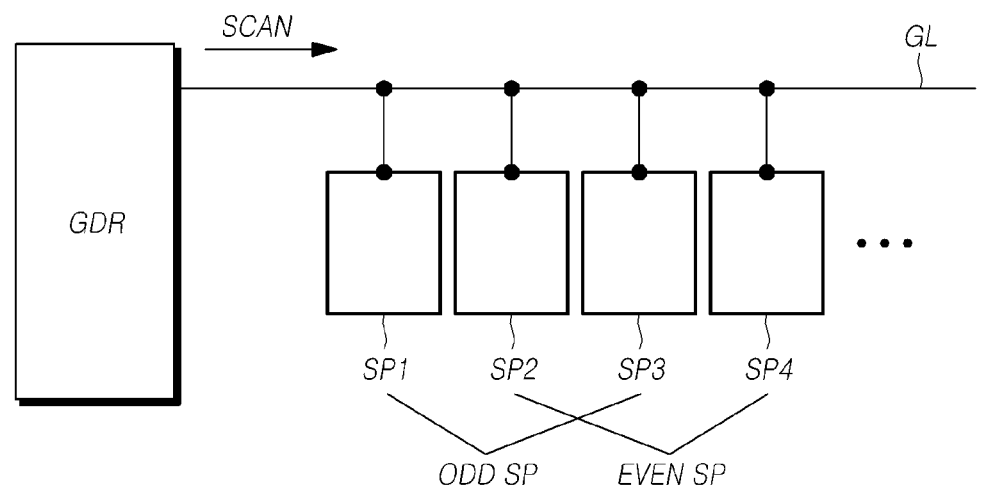
FIG. 7 illustrates non-independent gate driving in the display device according to exemplary aspects.

FIG. 7 illustrates non-independent gate driving in the display device according to exemplary aspects.

Referring to FIG. 7, a plurality of subpixels SP1, SP2, SP3, SP4, and . . . may be disposed in a single subpixel line (i.e. a single subpixel row or a single subpixel column).

The plurality of subpixels SP1, SP2, SP3, SP4, and . . . disposed in the single subpixel line may include odd-numbered subpixels ODD SP (SP1, SP3, and . . . ) and even-numbered subpixels EVEN SP (SP2, SP4, and . . . ).

In gate driving, the gate driver GDR of the display device according to exemplary aspects may simultaneously supply a single scanning signal SCAN to all of the plurality of subpixels SP1, SP2, SP3, SP4, and . . . , disposed in the single subpixel line, through a single gate line GL.

The gate line GL illustrated in FIG. 7 may be the gate line GL illustrated in FIG. 3, the first gate line GL1 illustrated in FIG. 4, the first gate line GL1 or the second gate line GL2 illustrated in FIG. 5, or the nth scanning line SL[N], the (n−1)th scanning line SL[N−1], or the emission control line EML illustrated in FIG. 6. Thus, the scanning signal SCAN illustrated in FIG. 7 may be the scanning signal SCAN illustrated in FIG. 3, the first scanning signal SCAN1 illustrated in FIG. 4, first scanning signal SCAN1 or second scanning signal SCAN2 illustrated in FIG. 5, or the nth scanning signal SCAN[N], the (n−1)th scanning signal SCAN[N−1], or the emission control signal EM illustrated in FIG. 6.

Since, as described above, the gate driver GDR simultaneously supplies the single scanning signal SCAN to all of the plurality of subpixels SP1, SP2, SP3, SP4, and . . . , disposed in the single subpixel line, through the single gate line GL in the gate driving, a charging time and a characteristics compensation time (e.g. a threshold voltage compensation time) may be insufficient in sensing driving for detecting subpixel characteristics (e.g. a threshold voltage of the driving transistor DT).

When the charging time and the characteristics compensation time are insufficient as described above, the characteristics compensation may be performed erroneously, thereby causing degradations in image quality. In particular, when the display panel PNL has at least one of a larger area or higher resolution, the insufficiency of the charging time and the characteristics compensation time, as well as resultant degradations in image quality, may be further intensified.

In addition, in a case in which the subpixel structure requires two or more gate lines GL, as in the case of the 3T1C structure illustrated in FIG. 5 or the 7T1C structure illustrated in FIG. 6, the aperture ratio of the display panel PNL may be reduced. In particular, when the display panel PNL has at least one of a larger area or higher resolution, the aperture ratio of the display panel PNL may be further reduced.

Hereinafter, independent gate driving able to improve the aperture ratio of the display panel PNL and reduce the insufficiency of the charging time and the characteristics compensation time even in the case that the display panel PNL has at least one of a larger area or higher resolution, as well as a structure for the independent gate driving (i.e. a scanning signal transferring structure or a gate driving structure), will be described.

The first subpixel SP1, the second subpixel SP2, the third subpixel SP3, and the fourth subpixel SP4 disposed in a single subpixel line (e.g. a subpixel row or a subpixel column) will be described below by way of example. The first subpixel SP1 and the third subpixel SP3 will be regarded as odd-numbered subpixels ODD SP, while the second subpixel SP2 and the fourth subpixel SP4 will be regarded as even-numbered subpixels EVEN SP.

Figure 8:
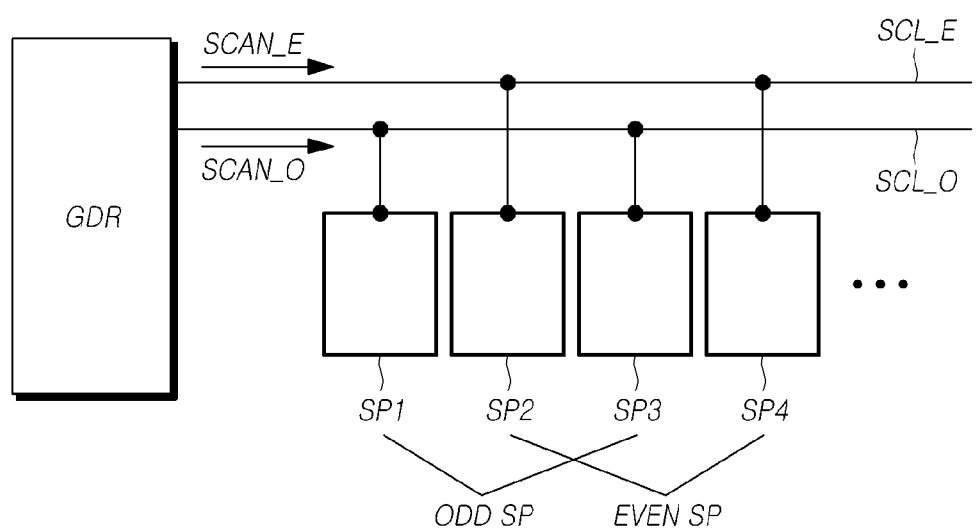
FIG. 8 illustrates independent gate driving in the display device according to exemplary aspects.

FIG. 8 illustrates independent gate driving in the display device according to exemplary aspects.

Referring to FIG. 8, the display panel PNL may include the first subpixel SP1, the second subpixel SP2, the third subpixel SP3, and the fourth subpixel SP4 arrayed sequentially in the same row (or the same subpixel row) or the same column (or the same subpixel column).

The display device according to exemplary aspects may perform independent gate driving on the odd-numbered subpixels ODD SP (SP1 and SP3) and the even-numbered subpixels EVEN SP (SP2 and SP4), among the subpixels SP1, SP2, SP3, and SP4 disposed in the same column or row.

For such independent gate driving, as illustrated in FIG. 8, the display panel PNL may include a first scanning signal transferring line SCL_O, through which a first scanning signal SCAN_O is transferred to the first subpixel SP1 and the third subpixel SP3 of the odd-numbered subpixels ODD SP, and a second scanning signal transferring line SCL_E, through which a second scanning signal SCAN_E is transferred to the second subpixel SP2 and the fourth subpixel SP4 of the even-numbered subpixels EVEN SP. The first scanning signal transferring line SCL_O and the second scanning signal transferring line SCL_E will be described in more detail with reference to FIG. 9.

The gate driver GDR may simultaneously supply the first scanning signal SCAN_O to the first subpixel SP1 and the third subpixel SP3 of the odd-numbered subpixels ODD SP through the first scanning signal transferring line SCL_O.

In addition, the gate driver GDR may simultaneously supply the second scanning signal SCAN_E to the second subpixel SP2 and the fourth subpixel SP4 of the even-numbered subpixels EVEN SP through the second scanning signal transferring line SCL_E.

According to the independent gate driving, the gate driver GDR may simultaneously drive the odd-numbered subpixels ODD SP, such as the first subpixel SP1 and the third subpixel SP3, and may simultaneously drive the even-numbered subpixels EVEN SP, such as the second subpixel SP2 and the fourth subpixel SP4, in the same row or column, instead of simultaneously driving all of the first to fourth subpixels SP1, SP2, SP3, and SP4 disposed in the same row or column.

According to the independent gate driving, the odd-numbered subpixels ODD SP, such as the first subpixel SP1 and the third subpixel SP3, and the even-numbered subpixels EVEN SP, such as the second subpixel SP2 and the fourth subpixel SP4, may be subjected to sensing driving without being influenced with each other. Thus, in the sensing driving, the insufficiency of the charging time or the characteristics compensation time, as well as resultant degradations in image quality, may be reduced or completely removed.

The first scanning signal transferring line SCL_O illustrated in FIG. 8 may be a plurality of patterns (e.g. electrodes and lines) electrically connected to transfer the first scanning signal SCAN_O. The second scanning signal transferring line SCL_E may be a plurality of patterns (e.g. electrodes and lines) electrically connected to transfer the second scanning signal SCAN_E.

Each of the first scanning signal transferring line SCL_O and the second scanning signal transferring line SCL_E may have the same function as the gate line GL illustrated in FIG. 3, the first gate line GL1 illustrated in FIG. 4, the first gate line GL1 or the second gate line GL2 illustrated in FIG. 5, or the nth scanning line SL[N], the (n−1)th scanning line SL[N−1], or the emission control line EML illustrated in FIG. 6.

Thus, the two scanning signals SCAN_O and SCAN_E illustrated in FIG. 8 may have the same function as the single scanning signal SCAN illustrated in FIG. 3, the single first scanning signal SCAN1 illustrated in FIG. 4, the single first scanning signal SCAN1 or the single second scanning signal SCAN2 illustrated in FIG. 5, or the single nth scanning signal SCAN[N], the single (n−1)th scanning signal SCAN[N−1], or the single emission control signal EM illustrated in FIG. 6.

Referring to FIG. 3, each of the odd-numbered subpixels ODD SP (SP1 and SP3) among the plurality of subpixels SP disposed in the LCD display panel PNL may include the scanning transistor T1 on-off controlled by the first scanning signal SCAN_O illustrated in FIG. 8. Each of the even-numbered subpixels EVEN SP (SP2 and SP4) among the plurality of subpixels SP may include the scanning transistor T1 on-off controlled by the second scanning signal SCAN_E.

Referring to FIG. 3, the scanning transistor T1 included in each of the first subpixel SP1 and the third subpixel SP3 of the odd-numbered subpixels ODD SP may operate independently of the scanning transistor T1 included in each of the second subpixel SP2 and the fourth subpixel SP4 of the even-numbered subpixels EVEN SP.

That is, the scanning transistor T1 included in each of the first subpixel SP1 and the third subpixel SP3 of the odd-numbered subpixels ODD SP and the scanning transistor T1 included in each of the second subpixel SP2 and the fourth subpixel SP4 of the even-numbered subpixels EVEN SP may be turned on or off at different points in time, even in the case that the transistors may be turned on or off at the same point in time.

Referring to FIG. 4 and FIG. 5, each of the odd-numbered subpixels ODD SP (SP1 and SP3) among the plurality of subpixels SP disposed in the OLED display panel PNL may include a light-emitting element, such as the organic light-emitting diode OLED, the driving transistor DT driving the light-emitting element, and one or more scanning transistors (one or more of T1 and T2) on-off controlled by the first scanning signal SCAN_O illustrated in FIG. 8. Each of the even-numbered subpixels EVEN SP (SP2 and SP4) among the plurality of subpixels SP may include a light-emitting element, such as the organic light-emitting diode OLED, the driving transistor DT driving the light-emitting element, and one or more scanning transistors (one or more of T1 and T2) on-off controlled by the second scanning signal SCAN_E illustrated in FIG. 8.

Referring to FIG. 4 and FIG. 5, the one or more scanning transistors (one or more of T1 and T2) included in each of the first subpixel SP1 and the third subpixel SP3 of the odd-numbered subpixels ODD SP may operate independently of the one or more scanning transistors (one or more of T1 and T2) included in each of the second subpixel SP2 and fourth subpixel SP4 of the even-numbered subpixels EVEN SP.

That is, the one or more scanning transistors (one or more of T1 and T2) included in each of the first subpixel SP1 and the third subpixel SP3 of the odd-numbered subpixels ODD SP and the one or more scanning transistors (one or more of T1 and T2) included in each of the second subpixel SP2 and fourth subpixel SP4 of the even-numbered subpixels EVEN SP may be turned on or off at different points in time, even in the case that the transistors may be turned on or off at the same point in time.

Referring to FIG. 6, each of the odd-numbered subpixels ODD SP (SP1 and SP3) among the plurality of subpixels SP disposed in the OLED display panel PNL may include a light-emitting element, such as the organic light-emitting diode OLED, the driving transistor DT driving the light-emitting element, and one or more scanning transistors (one or more among T1 to T6) on-off controlled by the first scanning signal SCAN_O illustrated in FIG. 8. Each of the even-numbered subpixels EVEN SP (SP2 and SP4) among the plurality of subpixels SP may include a light-emitting element, such as the organic light-emitting diode OLED, the driving transistor DT driving the light-emitting element, and one or more scanning transistors (one or more among T1 to T6) on-off controlled by the second scanning signal SCAN_E illustrated in FIG. 8.

Referring to FIG. 6, the one or more scanning transistors (one or more among T1 to T6) included in each of the first subpixel SP1 and the third subpixel SP3 of the odd-numbered subpixels ODD SP may operate independently of the one or more scanning transistors (one or more among T1 to T6) included in each of the second subpixel SP2 and fourth subpixel SP4 of the even-numbered subpixels EVEN SP.

That is, the one or more scanning transistors (one or more among T1 to T6) included in each of the first subpixel SP1 and the third subpixel SP3 of the odd-numbered subpixels ODD SP and the one or more scanning transistors (one or more among T1 to T6) included in each of the second subpixel SP2 and fourth subpixel SP4 of the even-numbered subpixels EVEN SP may be turned on or off at different points in time, even in the case that the transistors may be turned on or off at the same point in time.

When the subpixel structure, such as the 7T1C subpixel structure illustrated in FIG. 6, using the emission control signal EM, are described again, first type scanning signals SCAN[N−1] and SCAN[N] and a second type scanning signal EM may be supplied to each of the plurality of subpixels SP disposed in the OLED display panel PNL.

That is, each of the plurality of subpixels SP may include one or more first scanning transistors T1, T2, T5, and T6 performing on-off operations in response to the first type scanning signals SCAN[N−1] and SCAN[N] and one or more second scanning transistors T3 and T4 (also referred to as EM transistors) performing on-off operations in response to the second type scanning signal EM.

According to the overall independent gate driving mode, the one or more first scanning transistors T1, T2, T5, and T6, included in the odd-numbered subpixels ODD SP including the first subpixel SP1 and the third subpixel SP3, may operate independently of the one or more first scanning transistors T1, T2, T5, and T6 included in the even-numbered subpixels EVEN SP including the second subpixel SP2 and the fourth subpixel SP4. In addition, the one or more second scanning transistors T3 and T4, included in the odd-numbered subpixels ODD SP including the first subpixel SP1 and the third subpixel SP3, may operate independently of the one or more second scanning transistors T3 and T4 included in the even-numbered subpixels EVEN SP including the second subpixel SP2 and the fourth subpixel SP4.

According to partial independent gate driving mode, the one or more first scanning transistors T1, T2, T5, and T6, included in the odd-numbered subpixels ODD SP including the first subpixel SP1 and the third subpixel SP3, may operate independently of the one or more first scanning transistors T1, T2, T5, and T6 included in the even-numbered subpixels EVEN SP including the second subpixel SP2 and the fourth subpixel SP4. However, the one or more second scanning transistors T3 and T4, included in the odd-numbered subpixels ODD SP including the first subpixel SP1 and the third subpixel SP3, may operate in the same manner as the one or more second scanning transistors T3 and T4 included in the even-numbered subpixels EVEN SP including the second subpixel SP2 and the fourth subpixel SP4.

Hereinafter, a scanning signal transferring structure for the independent gate driving mode as described above will be described in detail.

Figure 9:
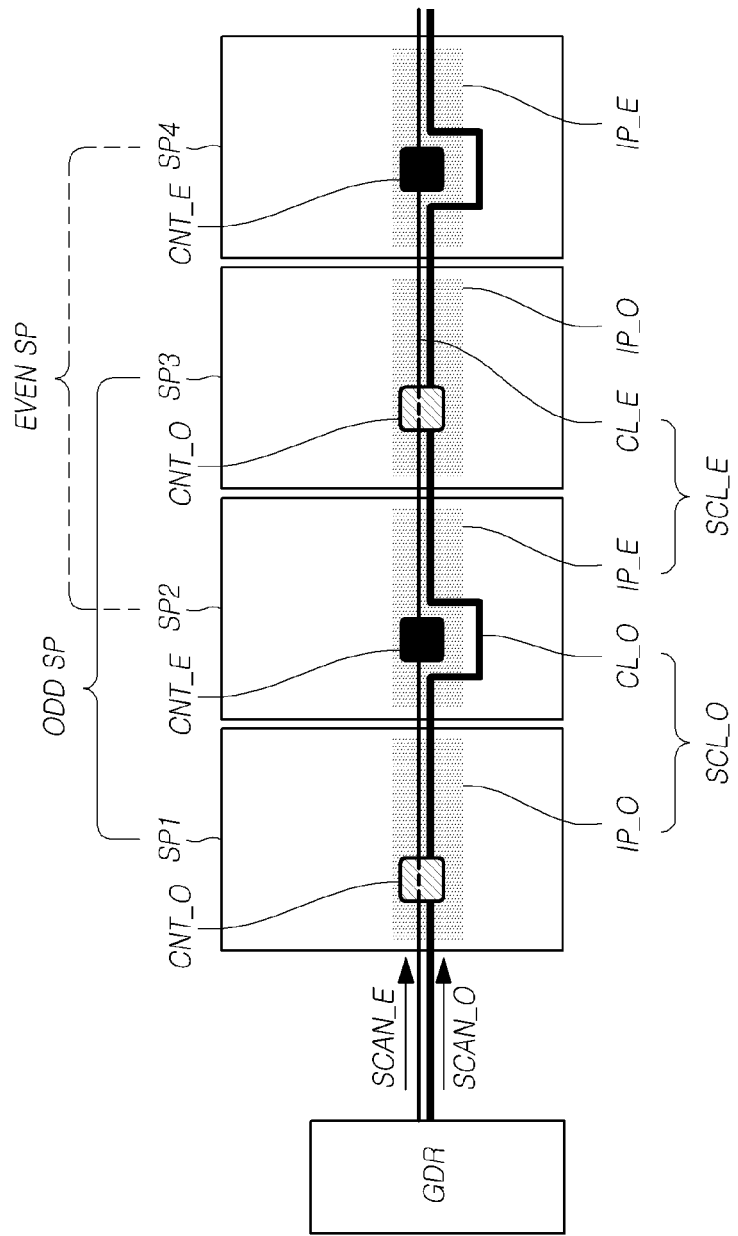
FIG. 9 schematically illustrates the scanning signal transferring structure for the independent gate driving in the display device according to exemplary aspect.

FIG. 9 schematically illustrates the scanning signal transferring structure for the independent gate driving in the display device according to exemplary aspect.

As described above, the display device according to exemplary aspects may perform the gate driving for the subpixels SP1, SP2, SP3, and SP4 disposed in the same row or column so that the odd-numbered subpixels ODD SP (SP1 and SP3) and the even-numbered subpixels EVEN SP (SP2 and SP4) are driven independently of each other.

For the independent gate driving, as illustrated in FIG. 9, the display panel PNL may include the first scanning signal transferring line SCL_O, through which the first scanning signal SCAN_O is transferred to the first subpixel SP1 and the third subpixel SP3 of the odd-numbered subpixels ODD SP, and the second scanning signal transferring line SCL_E, through which the second scanning signal SCAN_E is transferred to the second subpixel SP2 and fourth subpixel SP4 of the even-numbered subpixels EVEN SP.

Here, the scanning transistors, in the first subpixel SP1 and the third subpixel SP3 of the odd-numbered subpixels ODD SP, to which the first scanning signal SCAN_O is applied, are the same type of transistors as the scanning transistors, in the second subpixel SP2 and fourth subpixel SP4 of the even-numbered subpixels EVEN SP, to which the second scanning signal SCAN_E is applied.

Referring to FIG. 9, the first scanning signal transferring line SCL_O and the second scanning signal transferring line SCL_E may be disposed in different layers, with an insulating layer being disposed therebetween.

Accordingly, the first scanning signal transferring line SCL_O and the second scanning signal transferring line SCL_E may be disposed in a top-bottom direction. For example, when the first scanning signal transferring line SCL_O is disposed on a first metal layer, the second scanning signal transferring line SCL_E may be disposed on a metal layer higher than the first metal layer. In addition, when the second scanning signal transferring line SCL_E is disposed on the first metal layer, the first scanning signal transferring line SCL_O may be disposed on a metal layer higher than the first metal layer.

According to the above-described top-bottom arrangement structure, a greater number of scanning signal lines can be disposed for the independent gate driving mode than for a non-independent gate driving mode, without reducing the aperture ratio of the display panel PNL.

In addition, according to the above-described independent gate driving, the display device according to exemplary aspects can perform the sensing driving (or independent compensation driving) on the subpixels SP1, SP2, SP3, and SP4 disposed in the same row or column, so that the odd-numbered subpixels ODD SP (SP1 and SP3) are driven independently of the even-numbered subpixels EVEN SP (SP2 and SP4).

According to the independent gate driving, the display device according to exemplary aspects can perform the sensing driving (or compensation driving) on the subpixels SP1, SP2, SP3, and SP4 disposed in the same row or column, so that the odd-numbered subpixels ODD SP (SP1 and SP3) and the even-numbered subpixels EVEN SP (SP2 and SP4) are driven without influencing each other.

Accordingly, the display device according to exemplary aspects can obtain a greater amount of charging time and compensation time in the sensing driving (compensation driving) on the odd-numbered subpixels ODD SP (SP1 and SP3), and can obtain a greater amount of charging time and compensation time in the sensing driving (compensation driving) on the even-numbered subpixels EVEN SP (SP2 and SP4), the subpixels SP1, SP2, SP3, and SP4 being disposed in the same row or column.

In the case of the non-independent gate driving mode, the gate line GL corresponding to the scanning signal transferring line in the active area A/A may be implemented as a single line. Here, the single line may be a line formed on a single layer.

In contrast, in the case of the independent gate driving mode, as illustrated in FIG. 9, the first scanning signal transferring line SCL_O may be a combination of electrically-connected lines, i.e. two or more conductive patterns IP_O and CL_O, instead of being a single line. Here, the two or more conductive patterns IP_O and CL_O may be located in different layers disposed on both sides of an insulating layer.

Likewise, in the active area A/A, the second scanning signal transferring line SCL_E may be a combination of electrically-connected lines, i.e. two or more conductive patterns IP_E and CL_E, instead of being a single line. Here, the two or more conductive patterns IP_E and CL_E may be located in different layers disposed on both sides of an insulating layer.

The first scanning signal transferring line SCL_O and the second scanning signal transferring line SCL_E may be electrically disconnected from each other.

Referring to FIG. 9, the first scanning signal transferring line SCL_O may include a first island pattern IP_O comprised of elements disposed in the areas of the first subpixel SP1 and the third subpixel SP3, respectively, and a first connection line CL_O electrically connecting the element of the first island pattern IP_O disposed in the area of the first subpixel SP1 and the element of the first island pattern IP_O disposed in the area of the third subpixel SP3.

Referring to FIG. 9, a portion of the first connection line CL_0 may be electrically connected to the element of the first island pattern IP_O disposed in the area of the first subpixel SP1 through a first contact hole CNT_O, while another portion of the first connection line CL_0 may be electrically connected to the element of the first island pattern IP_O disposed in the area of the third subpixel SP3 through another first contact hole CNT_O.

Referring to FIG. 9, the second scanning signal transferring line SCL_E may include a second island pattern IP_E comprised of elements disposed in the areas of the second subpixel SP2 and the fourth subpixel SP4 and a second connection line CL_E electrically connecting the element of the second island pattern IP_E disposed in the area of the second subpixel SP2 and the element of the second island pattern IP_E disposed in the area of the fourth subpixel SP4.

Referring to FIG. 9, a portion of the second connection line CL_E may be electrically connected to the element of the second island pattern IP_E disposed in the area of the second subpixel SP2 through a second contact hole CNT_E, while another portion of the second connection line CL_E may be electrically connected to the element of the second island pattern IP_E disposed in the area of the fourth subpixel SP4 through another second contact hole CNT_E.

The first connection line CL_0 and the second connection line CL_E may be electrically disconnected from each other.

The first connection line CL_0 and the second connection line CL_E may be located in different layers disposed on both sides of an insulating layer.

The gate driver GDR drives the first connection line CL_0 and the second connection line CL_E independently of each other. That is, the gate driver GDR drives the first scanning signal transferring line SCL_O and the second scanning signal transferring line SCL_E independently of each other.

The expression "the first connection line CL_0 and the second connection line CL_E being driven independently of each other" or "the first scanning signal transferring line SCL_O and the second scanning signal transferring line SCL_E being driven independently of each other" used herein means that the driving timing of the first scanning signal transferring line SCL_O is unrelated to the driving timing of the second scanning signal transferring line SCL_E. This indicates that the first scanning signal SCAN_O and the second scanning signal SCAN_E may be transferred at the same point in time or at the different point in time.

The first connection line CL_0 may or may not overlap an active layer ACT. However, in a case in which the first connection line CL_0 overlaps the active layer ACT, a different metal layer must be present between the first connection line CL_0 and the active layer ACT, in the area in which the first connection line CL_0 overlaps the active layer ACT. Accordingly, the first connection line CL_0 is not exposed to the active layer ACT.

Likewise, the second connection line CL_E may or may not overlap the active layer ACT. However, in a case in which the second connection line CL_E overlaps the active layer ACT, a different metal layer must be present between the second connection line CL_E and the active layer ACT, in the area in which the second connection line CL_E overlaps the active layer ACT. Accordingly, second connection line CL_E is not exposed to the active layer ACT.

If the active layer ACT is not exposed as described above, one of the first connection line CL_0 and the second connection line CL_E, located on a higher layer, may be disposed freely, regardless of the contact holes between the other connection line, located on a lower layer, and the corresponding island pattern.

In contrast, the connection line, of the first connection line CL_0 and the second connection line CL_E, located on the lower layer, must be disposed so as to be spaced away from the contact holes between the other connection line, located on the higher layer, and the corresponding island pattern.

For example, in a case in which the second connection line CL_E is located on a higher layer than the first connection line CL_0, the second connection line CL_E located on the higher layer may be disposed freely, regardless of the first contact holes CNT_O between the first connection line CL_0, located on the lower layer, and the first island pattern IP_O. That is, the second connection line CL_E located on the higher layer may or may not overlap the first contact holes CNT_O between the first connection line CL_0, located on the lower layer, and the first island pattern IP_O.

However, the first connection line CL_0 located on the lower layer must be disposed so as to be spaced away from the second contact holes CNT_E between the second connection line CL_E, located on the higher layer, and the second island pattern IP_E. That is, the first connection line CL_0 located on the lower layer does not overlap the second contact holes CNT_E between the second connection line CL_E, located on the higher layer, and the second island pattern IP_E.

Figure 10:
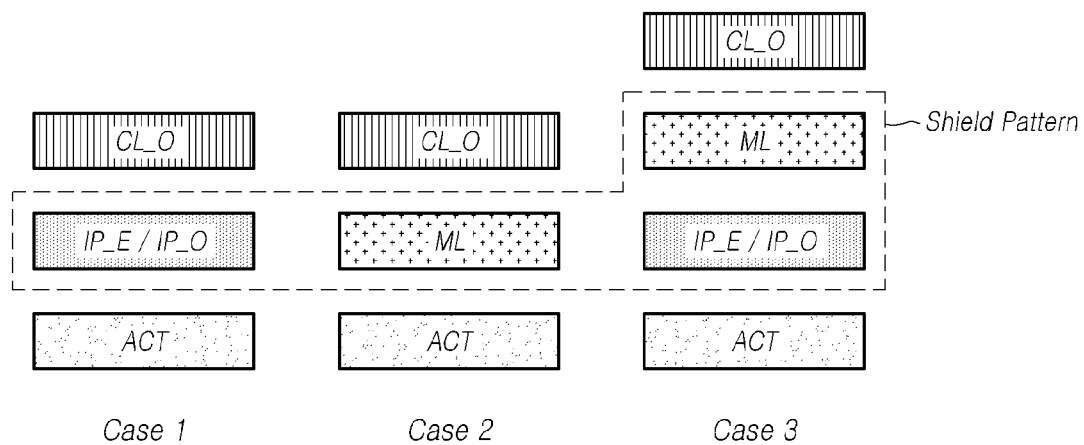
FIGS. 10, 11, and 12 illustrate characteristics of the scanning signal transferring structure for the independent gate driving in the display device according to exemplary aspects
Figure 11:
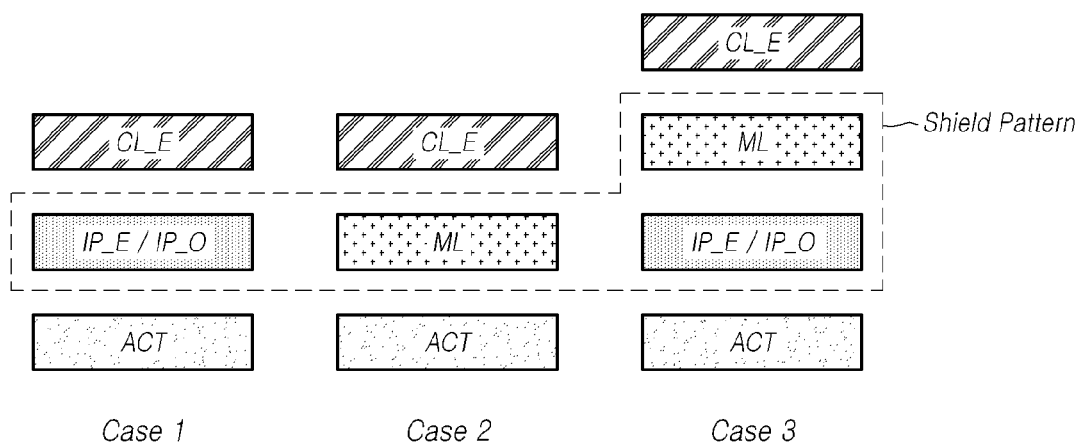
Figure 12:
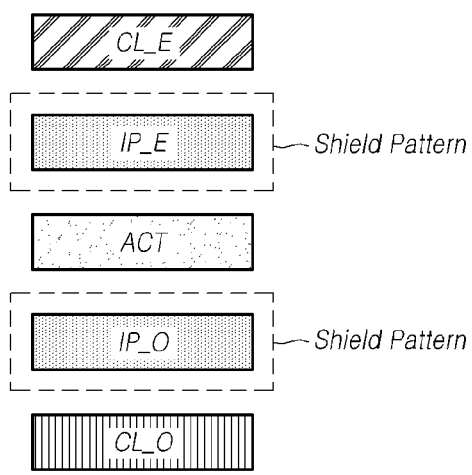

FIGS. 10, 11, and 12 illustrate characteristics of the scanning signal transferring structure for the independent gate driving in the display device according to exemplary aspects.

As illustrated in FIGS. 10 and 11, the first connection line CL_0 and the second connection line CL_E may be disposed in a layer located above the active layer ACT. Alternatively, the first connection line CL_0 and the second connection line CL_E may be disposed in a layer located below the active layer ACT.

As illustrated in FIG. 12, one of the first connection line CL_0 and the second connection line CL_E may be disposed in a layer located above the active layer ACT, and the other of the first connection line CL_0 and the second connection line CL_E may be disposed in a layer located below the active layer ACT. For example, the first connection line CL_0 may be disposed in a layer located below the active layer ACT, while the second connection line CL_E may be disposed in a layer located above the active layer ACT.

Referring to FIG. 10, the first connection line CL_0 may or may not overlap the active layer ACT.

As illustrated in FIG. 10, in a case in which the first connection line CL_0 overlaps the active layer ACT, the first connection line CL_0 may overlap a metal layer located between the first connection line CL_0 and the active layer ACT.

Referring to Case 1 in FIG. 10, the metal layer located between the first connection line CL_0 and the active layer ACT to prevent the first connection line CL_0 from being exposed to the active layer ACT may be a metal layer in which at least one of the first island pattern IP_O or the second island pattern IP_E is located.

Referring to Case 2 in FIG. 10, the metal layer located between the first connection line CL_0 and the active layer ACT to prevent the first connection line CL_0 from being exposed to the active layer ACT may be a metal layer ML different from the metal layer in which at least one of the first island pattern IP_O or the second island pattern IP_E is located.

Referring to Case 3 in FIG. 10, the metal layer located between the first connection line CL_0 and the active layer ACT to prevent the first connection line CL_0 from being exposed to the active layer ACT may include the metal layer in which at least one of the first island pattern IP_O or the second island pattern IP_E is located and the metal layer ML different from the metal layer in which at least one of the first island pattern IP_O or the second island pattern IP_E is located.

Referring to FIG. 11, the second connection line CL_E may or may not overlap the active layer ACT As illustrated in FIG. 11, in a case in which the second connection line CL_E overlaps the active layer ACT, the second connection line CL_E may overlap a metal layer located between the second connection line CL_E and the active layer ACT.

Referring to Case 1 in FIG. 11, the metal layer located between the second connection line CL_E and the active layer ACT to prevent the second connection line CL_E from being exposed to the active layer ACT may be a metal layer in which at least one of the first island pattern IP_O or the second island pattern IP_E is located.

Referring to Case 2 in FIG. 11, the metal layer located between the second connection line CL_E and the active layer ACT to prevent the second connection line CL_E from being exposed to the active layer ACT may be a metal layer ML different from the metal layer in which at least one of the first island pattern IP_O or the second island pattern IP_E is located.

Referring to Case 3 in FIG. 11, the metal layer located between the second connection line CL_E and the active layer ACT to prevent the second connection line CL_E from being exposed to the active layer ACT may include the metal layer in which at least one of the first island pattern IP_O or the second island pattern IP_E is located and the metal layer ML different from the metal layer in which at least one of the first island pattern IP_O or the second island pattern IP_E is located.

Referring to FIG. 12, the first connection line CL_0 may be located below the active layer ACT, and the second connection line CL_E may be located above the active layer ACT.

Referring to FIG. 12, the first connection line CL_0 may overlap a metal layer located between the first connection line CL_0 and the active layer ACT, in the area in which the first connection line CL_0 overlaps the active layer ACT. The first island pattern IP_O may be disposed on a same layer as the metal layer located between the first connection line CL_0 and the active layer ACT and may be electrically disconnected from the metal layer.

Referring to FIG. 12, the second connection line CL_E may overlap a metal layer located between the second connection line CL_E and the active layer ACT, in the area in which the second connection line CL_E overlaps the active layer ACT. The second island pattern IP_E may be disposed on a same layer as the metal layer located between the second connection line CL_E and the active layer ACT and may be electrically disconnected from the metal layer.

In other words, referring to FIGS. 10 to 12, the first connection line CL_0 and the second connection line CL_E can only extend above the metal layers covering the active layer ACT and preventing the active layer ACT from being exposed.

Each of the metal layers located between the first and second connection lines CL_O and CL_E and the active layer ACT to prevent the first and second connection lines CL_O and CL_E from being exposed to the active layer ACT, for example, may be a gate material layer including a gate material, of which at least one of the first island pattern IP_O or the second island pattern IP_E is made, or may include at least one of the gate material layer or a different metal layer ML.

A metal disposed in the metal layer between either the first connection line CL_O or the second connection line CL_E and the active layer ACT to prevent the first and second connection lines CL_O and CL_E from being exposed to the active layer ACT is referred to as a shield pattern.

Of course, it is not necessarily required that the first connection line CL_0 and the second connection line CL_E extend above the metal layer, in the area in which either the first connection line CL_0 or the second connection line CL_E does not overlap the active layer ACT.

In addition, the distance between the layer in which the first connection line CL_0 is located and the layer in which the first island pattern IP_O is located may be shorter than the distance between the layer in which second connection line CL_E is located and the layer in which the second island pattern IP_E is located.

In addition, the first connection line CL_0 may be disposed to bypass the second contact holes CNT_E, through which the second connection line CL_E contacts the second island pattern IP_E. That is, the first connection line CL_0 may be disposed so as not to overlap the second contact holes CNT_E, through which the second connection line CL_E contacts the second island pattern IP_E.

The first island pattern IP_O and the second island pattern IP_E may be disposed in the same layer.

The layer in which the first island pattern IP_O and the second island pattern IP_E are located may be positioned above the active layer ACT.

The layer in which the first connection line CL_0 is located may be positioned higher than the layer in which the first island pattern IP_O and the second island pattern IP_E are located.

The layer in which the second connection line CL_E is located may be positioned higher than the layer in which the first connection line CL_0.

The first island pattern IP_O and the second island pattern IP_E may be disposed in different layers.

The active layer ACT may be located between the layer in which the first island pattern IP_O is located and the layer in which the second island pattern IP_E is located.

The layer in which the first island pattern IP_O is located may be positioned below the layer in which the second island pattern IP_E is located.

The layer in which the second island pattern IP_E is located may be positioned above the active layer ACT, and the layer in which the second connection line CL_E is located may be positioned above the layer in which the second island pattern IP_E is located.

In a case in which the second connection line CL_E is located in a higher layer than the first connection line CL_0, the first connection line CL_0 may be disposed to bypass the second contact holes CNT_E, through which the second connection line CL_E is connected to the second island pattern IP_E.

Accordingly, the first connection line CL_0 can be protected from damage during fabrication of the second contact holes CNT_E in a panel fabrication process.

In a case in which the first connection line CL_0 is located in a higher layer than the second connection line CL_E, the second connection line CL_E may be disposed to bypass the first contact holes CNT_O, through which the first connection line CL_0 is connected to the first island pattern IP_O.

Accordingly, the second connection line CL_E can be protected from damage during fabrication of the first contact holes CNT_O in in the panel fabrication process.

Hereinafter, specific aspects of the above-described scanning signal transferring structure for the independent gate driving will be described with reference to FIGS. 13 to 17. A first layer stack of the display panel PNL will be described with reference to FIG. 13, and aspects of the scanning signal transferring structure for the independent gate driving in the first layer stack illustrated in FIG. 13 will be described with reference to FIGS. 14 and 15. A second layer stack of the display panel PNL will be described with reference to FIG. 16, and aspects of the scanning signal transferring structure for the independent gate driving in the second layer stack illustrated in FIG. 16 will be described with reference to FIG. 17.

Figure 13:
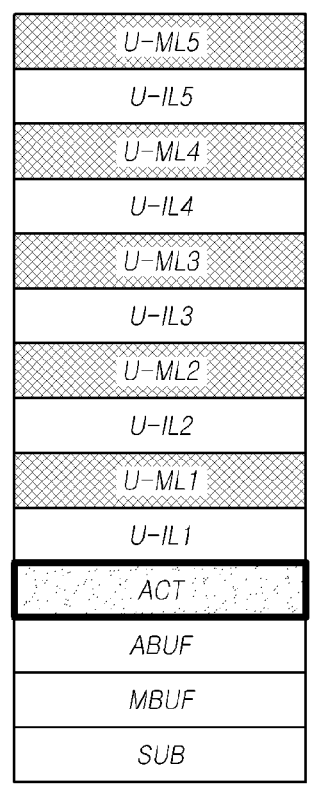
FIG. 13 illustrates the first layer stack as an aspect of the layer stack of the display panel according to exemplary aspects.
Figure 16:
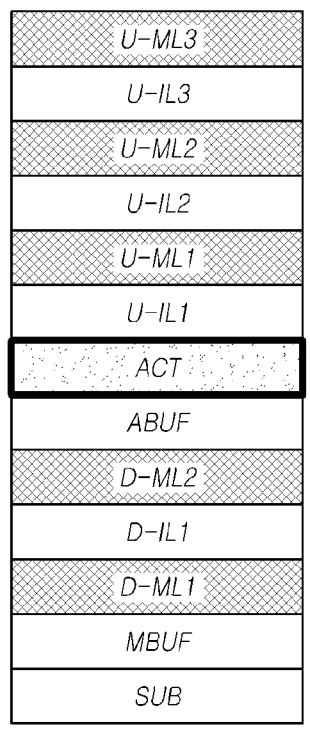
FIG. 16 illustrates the second layer stack as an aspect of the layer stack of the display panel according to exemplary aspects.

The first layer stack illustrated in FIG. 13 may be appropriate for the case in which the transistors disposed in the display panel PNL have a top gate structure, while the second layer stack illustrated in FIG. 16 may be appropriate for the case in which the transistors disposed in the display panel PNL have at least one of a top gate structure or a bottom gate structure.

FIG. 13 illustrates the first layer stack as an aspect of the layer stack of the display panel PNL according to exemplary aspects.

Referring to FIG. 13, the display panel PNL may include a substrate SUB, buffer layers, an active layer ACT, a plurality of metal layers U-ML1, U-ML2, . . . , and U-ML5, and a plurality of insulating layers U-IL1, U-IL2, . . . , and U-IL5.

The active layer ACT may be made of an oxide semiconductor. In this case, examples of the oxide semiconductor may include, but are not limited to, indium tin oxide (ITO), indium zinc oxide (IZO), indium tin zinc oxide (ITZO), or indium gallium zinc oxide (IGZO). In addition, examples of the oxide semiconductor may include, but not limited to, CuOx, SnOx, or NiO.

In addition, the active layer ACT may be made of amorphous silicon (a-Si), polycrystalline silicon (poly-Si), an organic semiconductor, or the like.

As illustrated in FIG. 13, the plurality of metal layers U-ML1, U-ML2, . . . , and U-ML5 of the layer stack according to exemplary aspects are located above the active layer ACT. In addition, one or more metal layers may be located below the active layer ACT.

The plurality of metal layers U-ML1, U-ML2, . . . , and U-ML5 may alternate with each the plurality of insulating layers U-IL1, U-IL2, . . . , and U-IL5.

The buffer layers on the substrate SUB may include a first buffer layer MBUF and a second buffer layer ABUF. The first buffer layer MBUF may be a multi-buffer layer comprised of a plurality of layers.

The active layer ACT may be located on the second buffer layer ABUF.

The first insulating layer U-IL1, the first metal layer U-ML1, the second insulating layer U-IL2, the second metal layer U-ML2, the third insulating layer U-IL3, the third metal layer U-ML3, the fourth insulating layer U-IL4, the fourth metal layer U-ML4, the fifth insulating layer U-IL5, and the fifth metal layer U-ML5 may be sequentially located on the active layer ACT.

Figure 14:
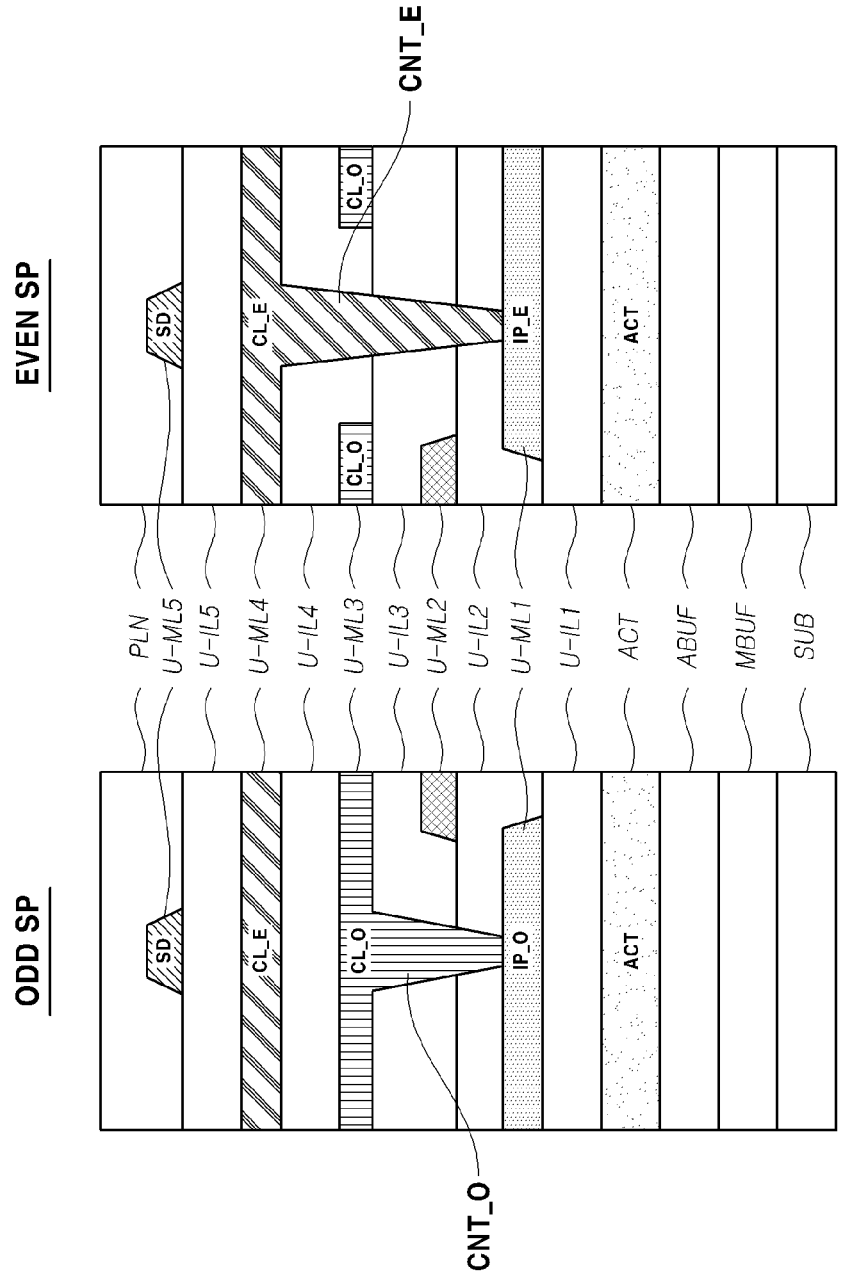
FIG. 14 illustrates cross-sectional structures of each of the odd-numbered subpixels and each of the even-numbered subpixels in the first layer stack of the display panel according to exemplary aspects.

FIG. 14 illustrates cross-sectional structures of each of the odd-numbered subpixels ODD SP and each of the even-numbered subpixels EVEN SP in the first layer stack of the display panel PNL according to exemplary aspects.

Referring to FIG. 14, the first island pattern IP_O and the second island pattern IP_E may be located in the same layer U-ML1.

For example, the first island pattern IP_O and the second island pattern IP_E may be located in the first metal layer U-ML1.

Here, the first metal layer U-ML1 may correspond to the gate material layer in which the gate electrode of the transistor is provided. The first insulating layer U-IL1 may correspond to a gate insulating film.

The first connection line CL_0 may be located in the third metal layer U-ML3.

The second connection line CL_E may be located in the fourth metal layer U-ML4.

The source and drain electrodes SD may be located in the fifth metal layer U-ML5.

The source and drain electrodes SD in the fifth metal layer U-ML5 may be covered with a planarization layer PLN.

The first metal layer U-ML1 or the second metal layer U-ML2 may correspond to a shield pattern preventing the first connection line CL_0 and the second connection line CL_E from being exposed to the active layer ACT. That is, the shield pattern is a pattern preventing the first connection line CL_0 and the second connection line CL_E from being directly exposed to the active layer ACT.

In other words, in the area in which the first connection line CL_0 overlaps the active layer ACT, the first connection line CL_0 may overlap the first metal layer U-ML1 or the second metal layer U-ML2 corresponding to the shield pattern. In the area in which the second connection line CL_E overlaps the active layer ACT, the second connection line CL_E may overlap the first metal layer U-ML1 or the second metal layer U-ML2 corresponding to the shield pattern.

Accordingly, since the shield pattern prevents the first connection line CL_0 and the second connection line CL_E from being directly exposed to the active layer ACT, the electrical conditions of the first connection line CL_0 and the second connection line CL_E can be prevented from being influenced by the active layer ACT or the electrical state of the active layer ACT can be prevented from being influenced by the first connection line CL_0 or the second connection line CL_E.

The layer U-ML1 in which the first island pattern IP_O and the second island pattern IP_E are located may be positioned above the active layer ACT.

The layer U-ML3 in which the first connection line CL_0 is located may be positioned above the layer U-ML1 in which the first island pattern IP_O and the second island pattern IP_E are located.

The layer U-ML4 in which the second connection line CL_E is located may be positioned above the layer U-ML3 in which the first connection line CL_0 is located.

The number of the layers through which the first contact holes CNT_O extend (i.e. the two layers U-IL3 and U-IL2) may be different from the number of the layers through which the second contact holes CNT_E extend (i.e. the three layers U-IL4, U-IL3, and U-IL2).

The distance between the layer U-ML3 in which the first connection line CL_0 is located and the layer U-ML1 in which the first island pattern IP_O is located may be shorter than the distance between the layer U-ML4 in which the second connection line CL_E is located and the layer U-ML1 in which the second island pattern IP_E is located.

Referring to FIG. 14, in the area of the even-numbered subpixel EVEN SP, the first connection line CL_0 may be disposed to bypass the second contact holes CNT_E.

Figure 15:
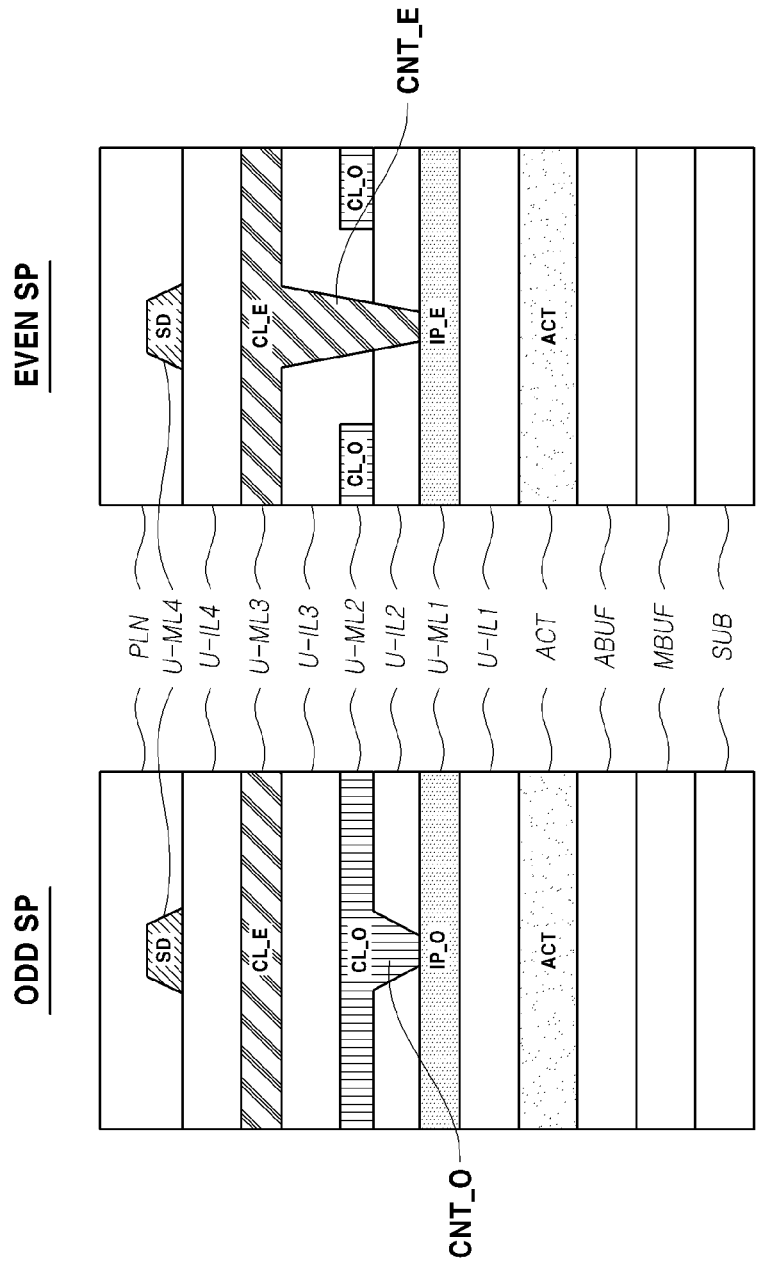
FIG. 15 illustrates other cross-sectional structures of each of the odd-numbered subpixels and each of the even-numbered subpixels in the first layer stack of the display panel according to exemplary aspects.

FIG. 15 illustrates other cross-sectional structures of each of the odd-numbered subpixels ODD SP and each of the even-numbered subpixels EVEN SP in the first layer stack of the display panel PNL according to exemplary aspects.

Referring to FIG. 15, the first island pattern IP_O and the second island pattern IP_E may be located in the same layer U-ML1.

For example, the first island pattern IP_O and the second island pattern IP_E may be located in the first metal layer U-ML1.

Here, the first metal layer U-ML1 may correspond to the gate material layer in which the gate electrode of the transistor is provided. The first insulating layer U-IL1 may correspond to the gate insulating film.

The first connection line CL_0 may be located in the second metal layer U-ML2.

The second connection line CL_E may be located in the third metal layer U-ML3.

The source and drain electrodes SD may be located in the fourth metal layer U-ML4.

The source and drain electrodes SD located in the fourth metal layer U-ML4 may be covered with a planarization layer PLN.

The first metal layer U-ML1 may correspond to the shield pattern of the active layer ACT, such that either the first connection line CL_0 or the second connection line CL_E is not exposed to the active layer ACT.

That is, the shield pattern is a pattern preventing the first connection line CL_0 and the second connection line CL_E from being directly exposed to the active layer ACT.

In other words, in the area in which the first connection line CL_0 overlaps the active layer ACT, the first connection line CL_0 may overlap the first metal layer U-ML1 corresponding to the shield pattern. In the area in which the second connection line CL_E overlaps the active layer ACT, the second connection line CL_E may overlap the first metal layer U-ML1 corresponding to the shield pattern.

Accordingly, since the shield pattern prevents the first connection line CL_0 and the second connection line CL_E from being directly exposed to the active layer ACT, the electrical conditions of the first connection line CL_0 and the second connection line CL_E can be prevented from being influenced by the active layer ACT or the electrical state of the active layer ACT can be prevented from being influenced by the first connection line CL_0 or the second connection line CL_E.

The layer U-ML1 in which the first island pattern IP_O and the second island pattern IP_E are located may be positioned above the active layer ACT.

The layer U-ML2 in which the first connection line CL_0 is located may be positioned above the layer U-ML1 in which the first island pattern IP_O and the second island pattern IP_E are located.

The layer U-ML3 in which the second connection line CL_E is located may be positioned above the layer U-ML2 in which the first connection line CL_0 is located.

The number of the layers through which the first contact holes CNT_O extend (i.e. the single layer U-IL2) may be different from the number of the layers through which the second contact holes CNT_E extend (i.e. the two layers U-IL3 and U-IL2).

The distance between the layer U-ML2 in which the first connection line CL_0 is located and the layer U-ML1 in which the first island pattern IP_O is located may be shorter than the distance between the layer U-ML3 in which the second connection line CL_E is located and the layer U-ML1 in which the second island pattern IP_E is located.

Referring to FIG. 15, in the area of the even-numbered subpixel EVEN SP, the first connection line CL_0 may be disposed to bypass the second contact holes CNT_E.

The stacked structures illustrated in FIGS. 13 to 15 are merely for illustrative purposes, from which some layers may be omitted, or to which some layers may be added. In addition, the stacked structure in the area of the odd-numbered subpixel ODD SP may be the same as or different from the stacked structure in the area of the even-numbered subpixel EVEN SP. In addition, in the area of at least one of the odd-numbered subpixel ODD SP or the even-numbered subpixel EVEN SP, the stacked structures may be the same or a portion of the stacked structures may be different.

FIG. 16 illustrates the second layer stack as an aspect of the layer stack of the display panel PNL according to exemplary aspects.

Referring to FIG. 16, the display panel PNL may include a substrate SUB, buffer layers, an active layer ACT, a plurality of metal layers D-ML1, D-ML2, U-ML1, U-ML2, U-ML3, and . . . , and a plurality of insulating layers D-IL1, U-IL1, U-IL2, U-IL3, and . . . .

As illustrated in FIG. 16, the plurality of metal layers D-ML1, D-ML2, U-ML1, U-ML2, U-ML3, and . . . of the layer stack according to exemplary aspects may be located above and below the active layer ACT. More metal layers may be present above and below the active layer ACT.

The plurality of metal layers D-ML1, D-ML2, U-ML1, U-ML2, U-ML3, and . . . may alternate with the plurality of insulating layers D-IL1, U-IL1, U-IL2, U-IL3, and . . . .

A first buffer layer MBUF may be located on the substrate SUB.

The first metal layer D-ML1 may be located on the first buffer layer MBUF.

The first insulating layer D-IL1 may be located on the first metal layer D-ML1.

The second metal layer D-ML2 may be located on the first insulating layer D-IL1.

A second buffer layer ABUF may be located on the second metal layer D-ML2.

The active layer ACT may be located on the second buffer layer ABUF.

The third insulating layer U-IL1 may be located on the active layer ACT.

The third metal layer U-ML1 may be located on the third insulating layer U-IL1.

The fourth insulating layer U-IL2 may be located on the third metal layer U-ML1.

The fourth metal layer U-ML2 may be located on the fourth insulating layer U-IL2.

A fifth insulating layer U-IL3 may be located on the fourth metal layer U-ML2.

A fifth metal layer U-ML3 may be located on the fifth insulating layer U-IL3.

Figure 17:
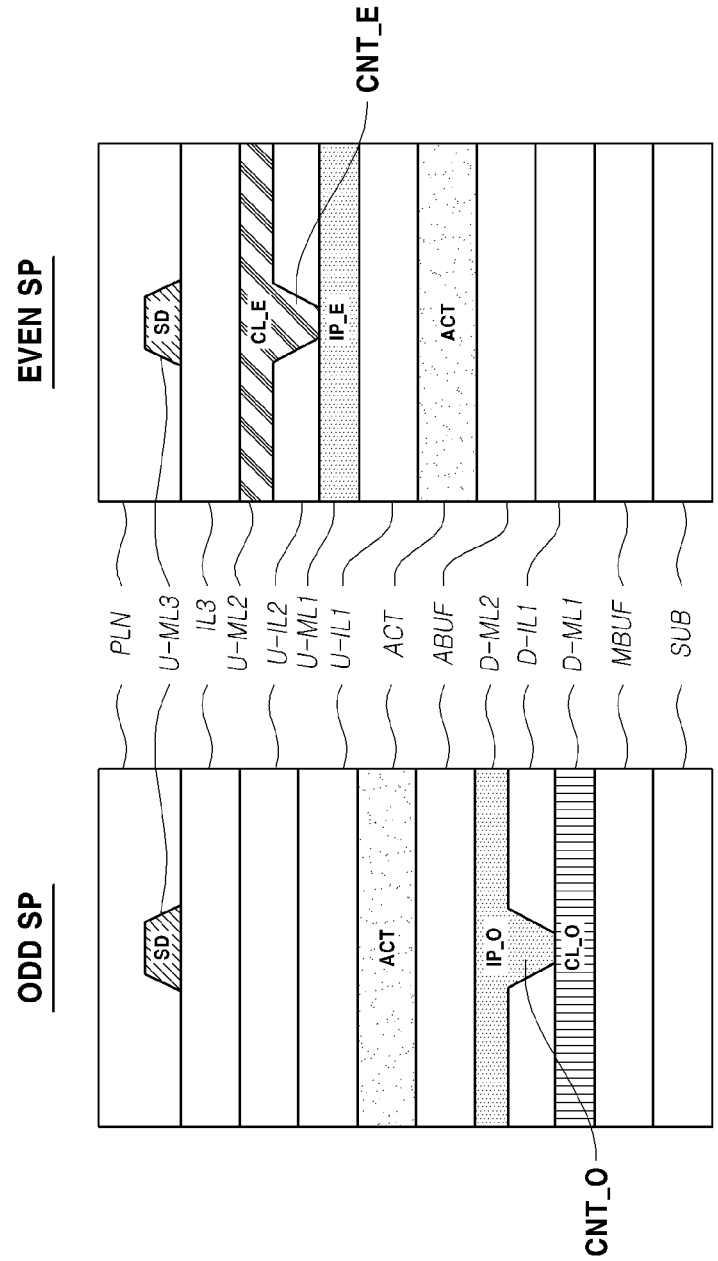
FIG. 17 illustrates cross-sectional structures of each of the odd-numbered subpixels and each of the even-numbered subpixels in the second layer stack of the display panel according to exemplary aspects.

FIG. 17 illustrates cross-sectional structures of each of the odd-numbered subpixels ODD SP and each of the even-numbered subpixels EVEN SP in the second layer stack of the display panel PNL according to exemplary aspects.

As illustrated in FIG. 17, the first island pattern IP_O and the second island pattern IP_E may be located in different layers.

For example, the first connection line CL_0 may be located in the first metal layer D-ML1 below the active layer ACT, and the first island pattern IP_O may be located in the second metal layer D-ML2 below the active layer ACT. That is, the active layer ACT may be located between the layer D-ML2 in which the first island pattern IP_O is located and the layer U-ML1 in which the second island pattern IP_E is located.

Here, for example, the second metal layer D-ML2 may be a gate material layer in which the gate electrode or the like of the transistor in the odd-numbered subpixel ODD SP is disposed. The buffer layer ABUF may be a gate insulating film.

The second island pattern IP_E may be located in the third metal layer U-ML1 above the active layer ACT, and the second connection line CL_E may be located in the fourth metal layer U-ML2 above the active layer ACT.

Here, the third metal layer U-ML1 may be a gate material layer in which the gate electrode or the like of the transistor in the even-numbered subpixels EVEN SP is disposed. The third insulating layer U-IL1 may be a gate insulating film.

The source and drain electrodes SD may be located in the fifth metal layer U-ML3.

The source and drain electrodes SD in the fifth metal layer U-ML3 may be covered with the planarization layer PLN.

The second metal layer D-ML2 and the third metal layer U-ML1 may correspond to shield patterns.

In the area in which the first connection line CL_0 overlaps the active layer ACT from below, the first connection line CL_0 may overlap the second metal layer D-ML2 corresponding to the shield pattern.

The second metal layer D-ML2 corresponding to the shield pattern can prevent the first connection line CL_0 from being directly exposed to the active layer ACT.

Accordingly, the electrical condition of the first connection line CL_0 can be prevented from being influenced by the active layer ACT, or the electrical condition of the active layer ACT can be prevented from being influenced by the first connection line CL_0.

In the area in which the second connection line CL_E overlaps the active layer ACT from above the active layer ACT, the second connection line CL_E may overlap the third metal layer U-ML1 corresponding to the shield pattern.

The third metal layer U-ML1 corresponding to the shield pattern can prevent the second connection line CL_E from being directly exposed to the active layer ACT.

Accordingly, the electrical condition of the second connection line CL_E can be prevented from being influenced by the active layer ACT, or the electrical condition of the active layer ACT can be prevented from being influenced by the second connection line CL_E.

Referring to FIG. 17, the layer D-ML2 in which the first island pattern IP_O is located may be positioned below the active layer ACT. The layer D-ML1 in which the first connection line CL_0 is located may be positioned below the layer D-ML2 in which the first island pattern IP_O is located.

The layer U-ML1 in which the second island pattern IP_E is located may be positioned above the active layer ACT. The U-ML2 in which the second connection line CL_E is located may be positioned above the layer U-ML1 in which the second island pattern IP_E is located.

Figure 18:
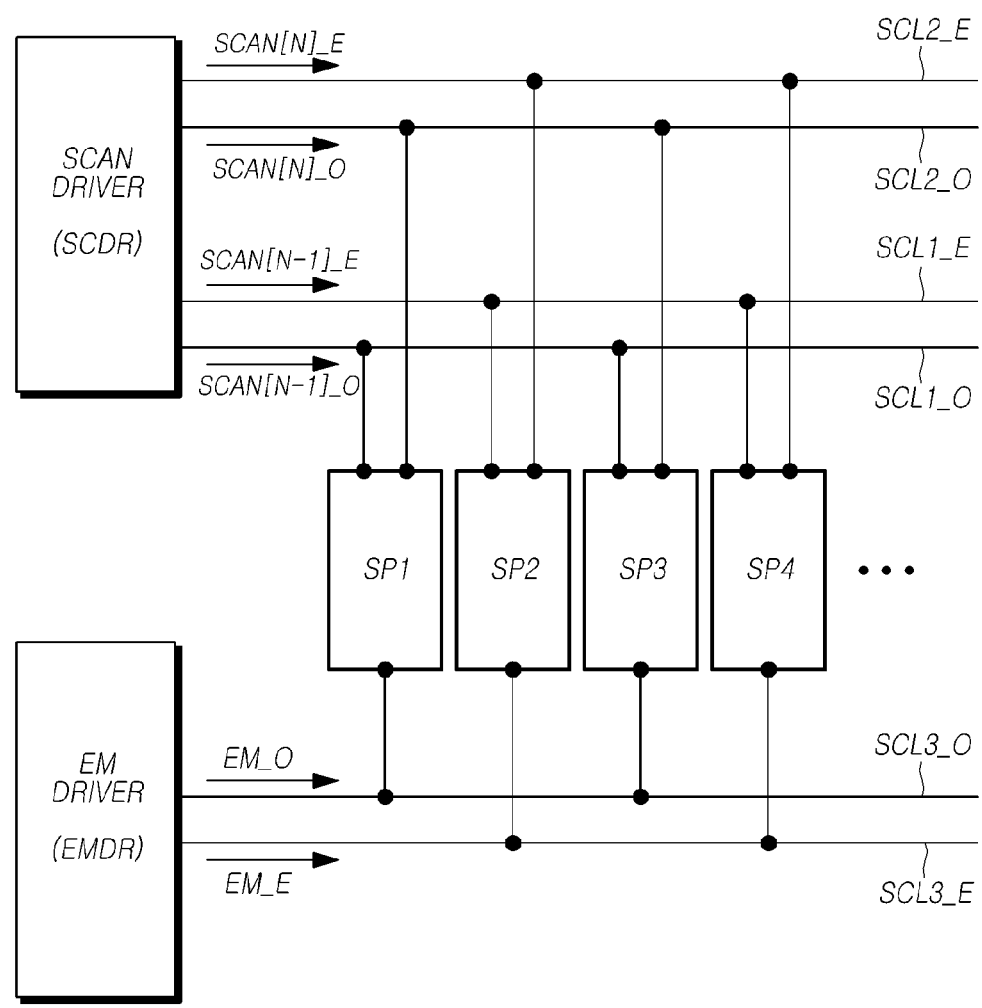
FIG. 18 illustrates overall independent gate driving in the display panel according to exemplary aspects in a case in which each of the subpixels has the 7T1C structure illustrated in FIG. 6.
Figure 19:
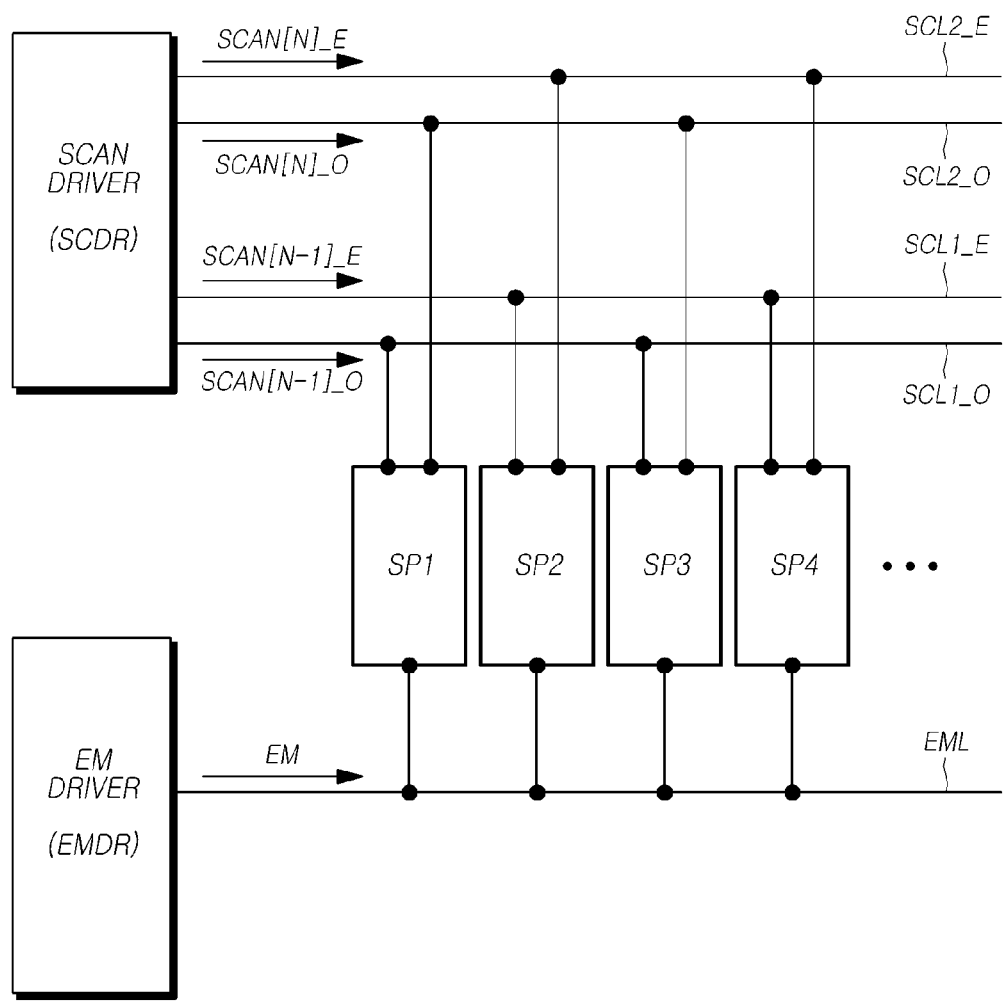
FIG. 19 illustrates partial independent gate driving in the display panel according to exemplary aspects in a case in which each of the subpixels has the 7T1C structure illustrated in FIG. 6.

FIG. 18 illustrates overall independent gate driving in the display panel PNL according to exemplary aspects in a case in which each of the subpixels has the 7T1C structure illustrated in FIG. 6. FIG. 19 illustrates partial independent gate driving in the display panel PNL according to exemplary aspects in a case in which each of the subpixels has the 7T1C structure illustrated in FIG. 6.

Referring to FIG. 18, as in the 7T1C structure illustrated in FIG. 6, first type scanning signals SCAN[N−1]_O, SCAN[N]_O, SCAN[N−1]_E, and SCAN[N]_E and second type scanning signals EM_O and EM_E may be supplied to each of the plurality of subpixels SP1, SP2, SP3, and SP4 arrayed in the same row or column in the display panel PNL in a case in which the subpixel uses the emission control signal EM.

Referring to FIG. 19, as in the 7T1C structure illustrated in FIG. 6, first type scanning signals SCAN[N−1]_O, SCAN[N]_O, SCAN[N−1]_E, and SCAN[N]_E and a second type scanning signal EM may be supplied to each of the plurality of subpixels SP1, SP2, SP3, and SP4 arrayed in the same row or column in the display panel PNL in a case in which the subpixel uses the emission control signal EM.

That is, each of the plurality of subpixels SP1, SP2, SP3, and SP4 arrayed in the same row or column in the display panel PNL may include one or more first scanning transistors T1, T2, T5, and T6 performing on-off operations in response to the first type scanning signals SCAN[N−1]_O, SCAN[N]_O, SCAN[N−1]_E, and SCAN[N]_E and one or more second scanning transistors T3 and T4 (also referred to EM transistors) performing on-off operations in response to the second type scanning signals EM_O, EM_E, and EM.

Referring to FIGS. 18 and 19, the gate driver GDR may include a scanning driver SCDR supplying the first type scanning signals SCAN[N−1]_O, SCAN[N]_O, SCAN[N−1]_E, and SCAN[N]_E to the one or more first scanning transistors T1, T2, T5, and T6 and an emission control driver EMDR supplying the second type scanning signals EM_O, EM_E, and EM to the one or more second scanning transistors T3 and T4 (also referred to EM transistors).

Referring to FIG. 18, the one or more first scanning transistors T1, T2, T5, and T6, included in the odd-numbered subpixels ODD SP including the first subpixel SP1 and the third subpixel SP3, may operate independently of the one or more first scanning transistors T1, T2, T5, and T6 included in the even-numbered subpixels EVEN SP including the second subpixel SP2 and the fourth subpixel SP4.

According to the independent gate driving mode, the scanning driver may supply the first type scanning signals SCAN[N−1]_O and SCAN[N]_O to the one or more first scanning transistors T1, T2, T5, and T6, included in the odd-numbered subpixels ODD SP including the first subpixel SP1 and the third subpixel SP3, through first scanning signal transferring lines SCL1_O and SCL2_O. The scanning driver SCDR may supply the first type scanning signals SCAN[N−1]_E and SCAN[N]_E to the one or more first scanning transistors T1, T2, T5, and T6, included in the even-numbered subpixels EVEN SP including the second subpixel SP2 and the fourth subpixel SP4, through first scanning signal transferring lines SCL1_E and SCL2_E.

In addition, according to the overall independent gate driving mode, the one or more second scanning transistors T3 and T4, included in the odd-numbered subpixels ODD SP including the first subpixel SP1 and the third subpixel SP3, may operate independently of the one or more second scanning transistors T3 and T4 included in the even-numbered subpixels EVEN SP including the second subpixel SP2 and the fourth subpixel SP4.

According to the independent gate driving mode, the emission control driver EMDR may supply the second type scanning signal EM_O to the one or more second scanning transistors T3 and T4 included in the odd-numbered subpixels ODD SP including the first subpixel SP1 and the third subpixel SP3, through a second scanning signal transferring line SCL3_O. The emission control driver EMDR may supply the second type scanning signal EM_E to the one or more second scanning transistors T3 and T4, included in the even-numbered subpixels EVEN SP including the second subpixel SP2 and the fourth subpixel SP4, through a second scanning signal transferring line SCL3_E.

Referring to FIG. 19, the one or more first scanning transistors T1, T2, T5, and T6, included in the odd-numbered subpixels ODD SP including the first subpixel SP1 and the third subpixel SP3, may operate independently of the one or more first scanning transistors T1, T2, T5, and T6 included in the even-numbered subpixels EVEN SP including the second subpixel SP2 and the fourth subpixel SP4.

According to the independent gate driving mode, the scanning driver SCDR may supply the first type scanning signals SCAN[N−1]_O and SCAN[N]_O to the one or more first scanning transistors T1, T2, T5, and T6, included in the odd-numbered subpixels ODD SP including the first subpixel SP1 and the third subpixel SP3, through the first scanning signal transferring lines SCL_O and SCL2_O. In addition, the scanning driver SCDR may supply the first type scanning signals SCAN[N−1]_E and SCAN[N]_E to the one or more first scanning transistors T1, T2, T5, and T6, included in the even-numbered subpixels EVEN SP including the second subpixel SP2 and the fourth subpixel SP4, through the first scanning signal transferring lines SCL1_E and SCL2_E.

However, according to the partial independent gate driving mode, the one or more second scanning transistors T3 and T4, included in the odd-numbered subpixels ODD SP including the first subpixel SP1 and the third subpixel SP3, may operate in the same manner as the one or more second scanning transistors T3 and T4 included in the even-numbered subpixels EVEN SP including the second subpixel SP2 and the fourth subpixel SP4.

According to the partial independent gate driving mode, the emission control driver EMDR may supply the second type scanning signal EM to the one or more second scanning transistors T3 and T4, included in each of the first to fourth subpixels SP1 to SP4, through the emission control line EML.

Figure 20:
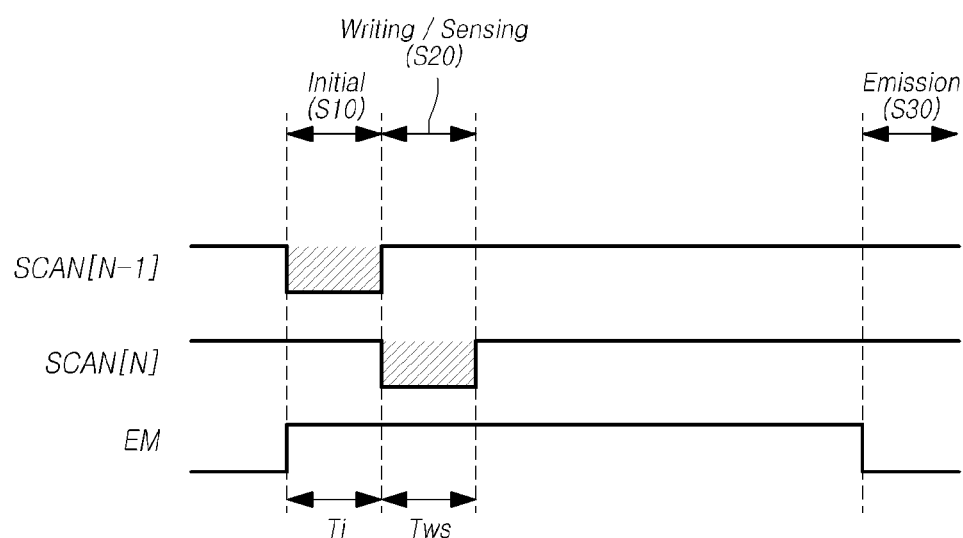
FIG. 20 illustrates a driving timing diagram in a case in which each of the subpixels in the display panel according to exemplary aspects has the 7T1C structure illustrated in FIG. 6.
Figure 21:
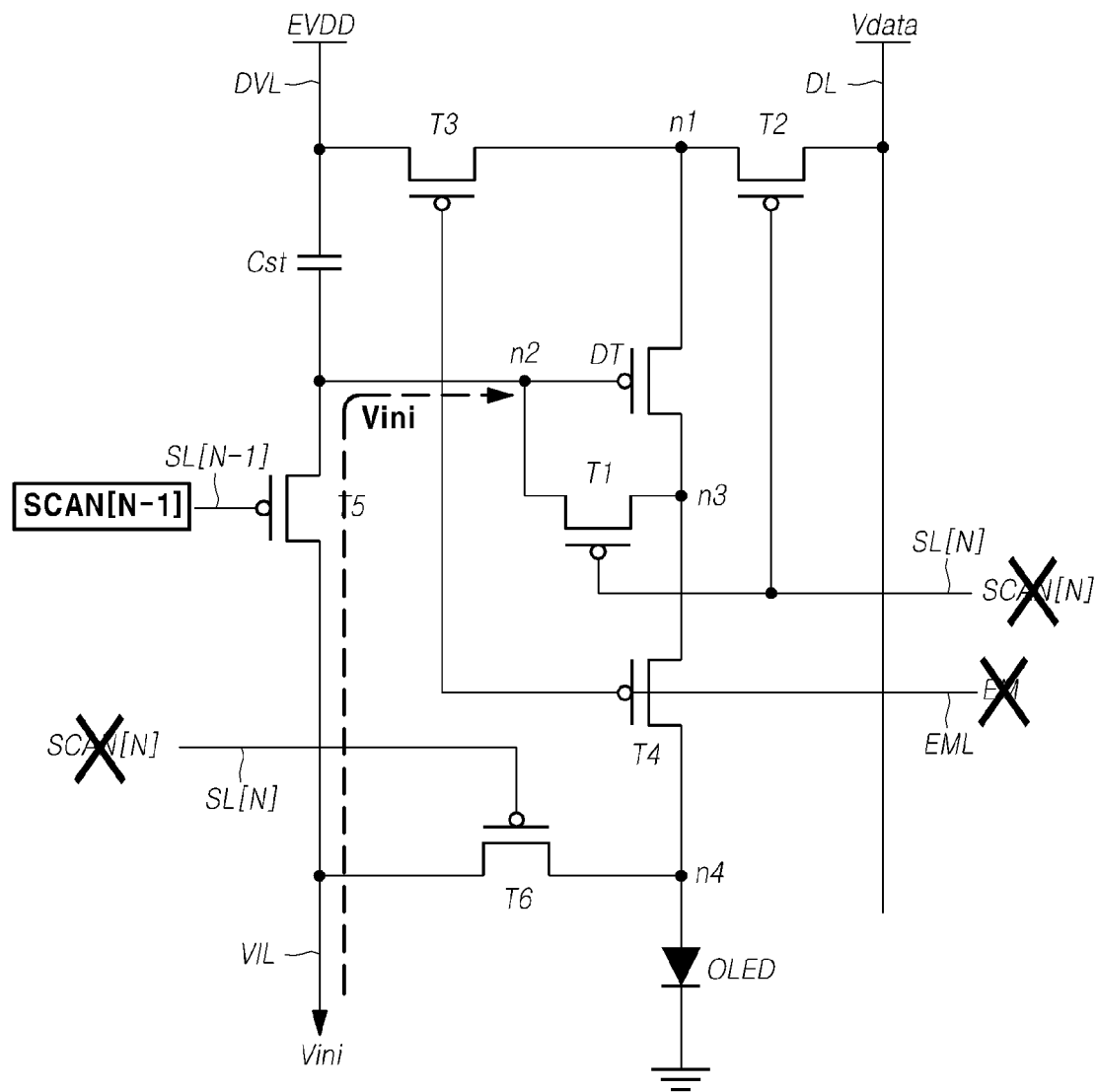
FIGS. 21, 22, and 23 illustrate operations of each of the subpixels according to the driving timing in a case in which each of the subpixels in the display panel according to exemplary aspects has the 7T1C structure illustrated in FIG. 6.
Figure 22:
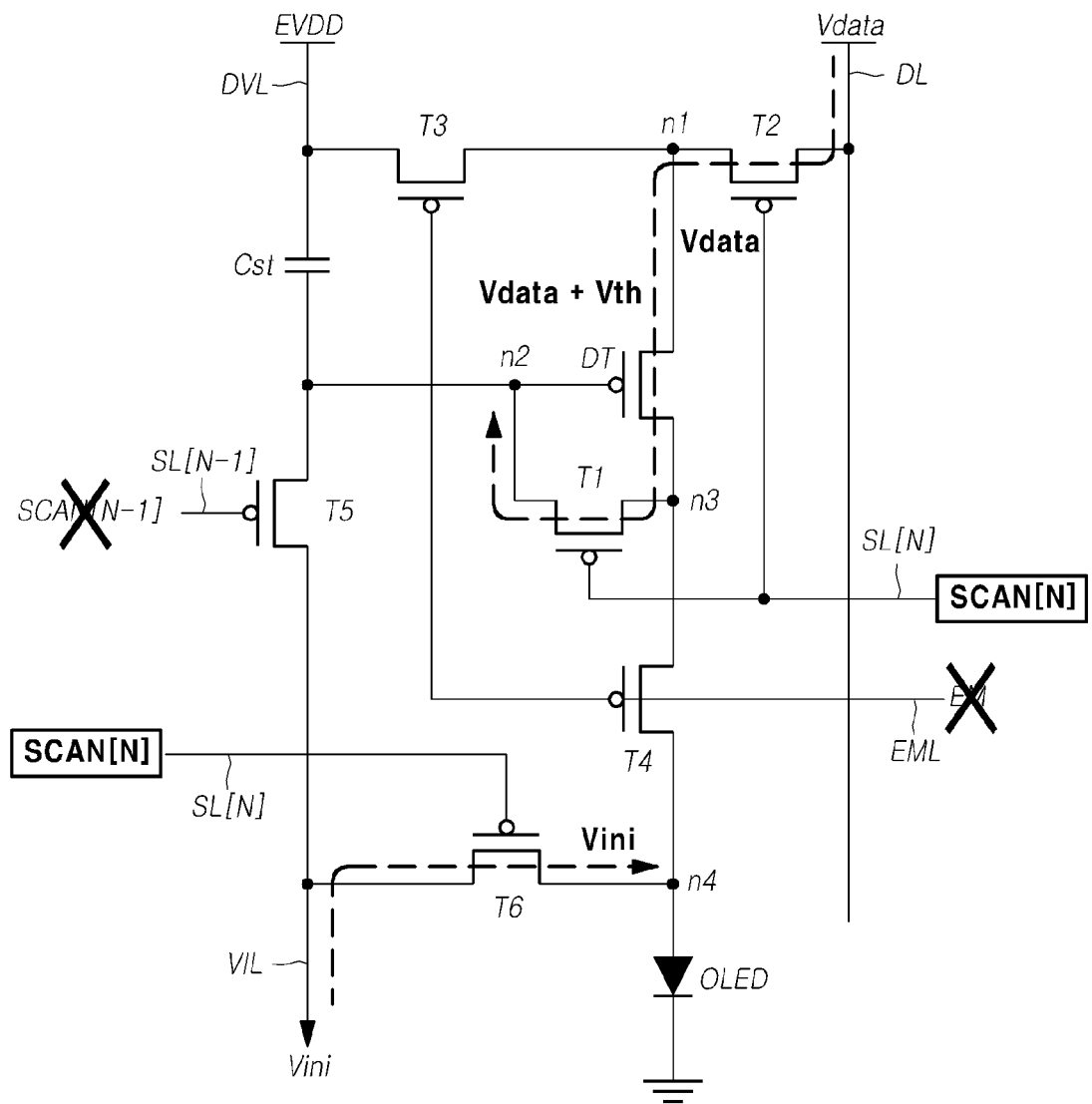
Figure 23:
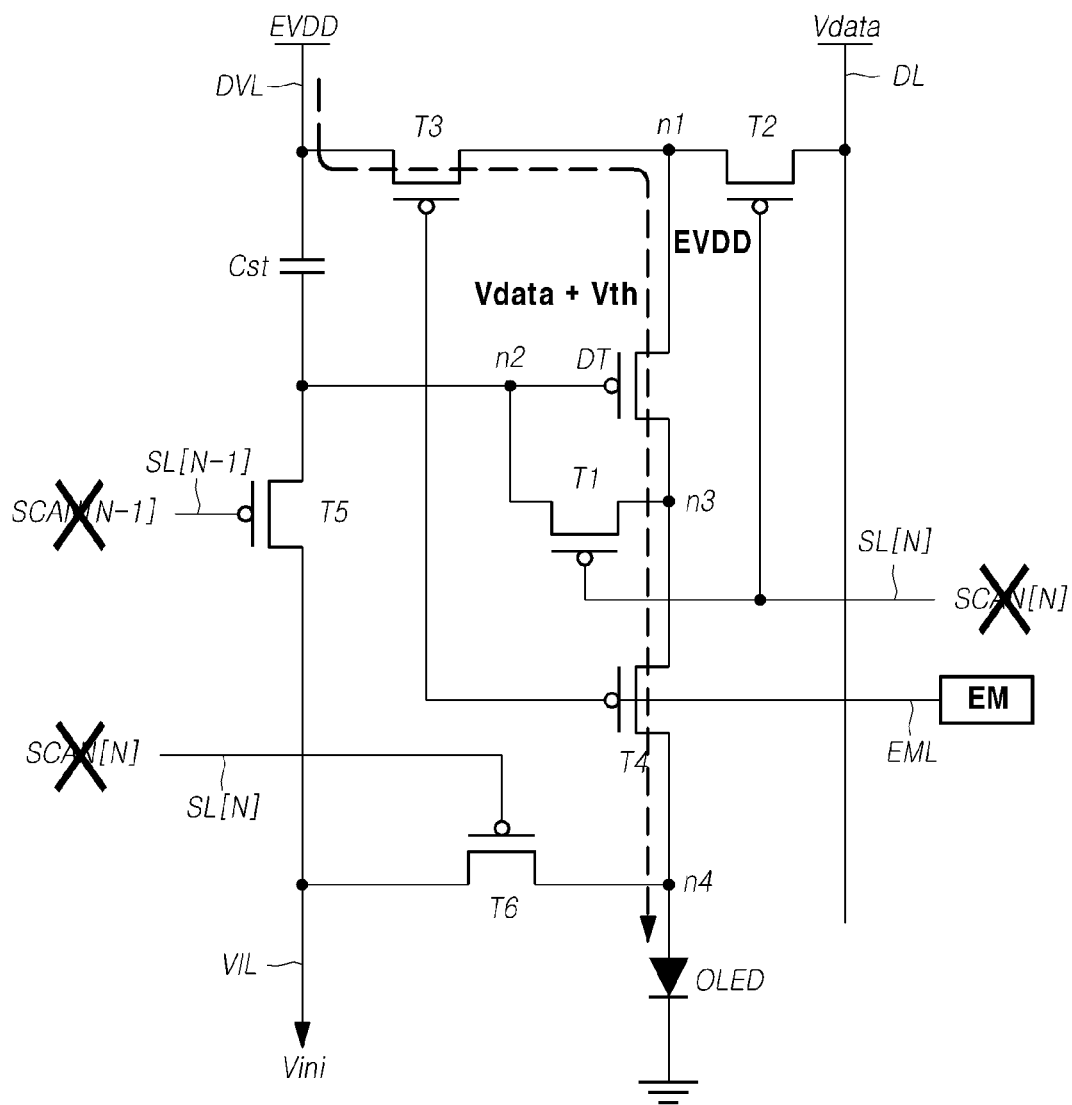
Figure 24:
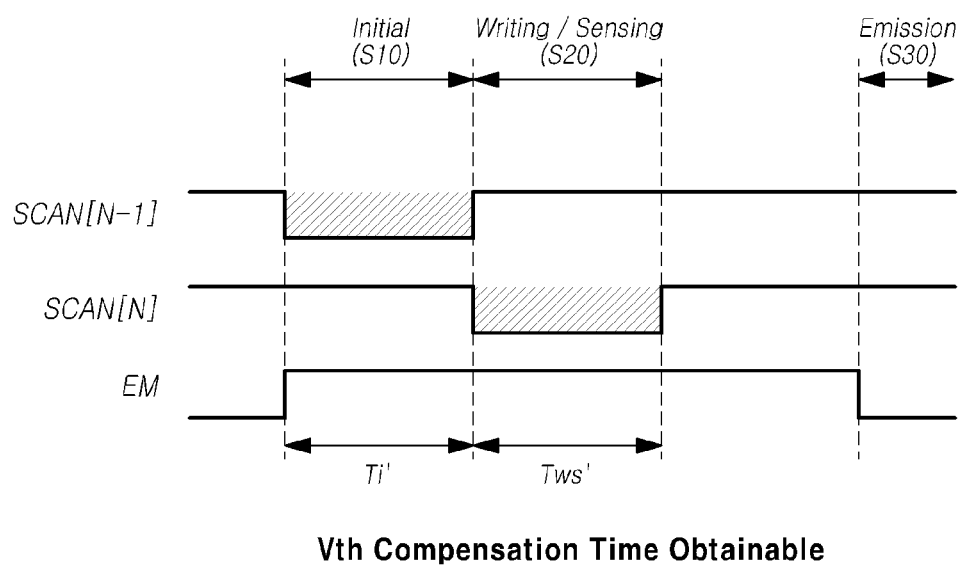
FIG. 24 illustrates a driving timing diagram according to the independent gate driving a case in which each of the subpixels in the display panel according to exemplary aspects has the 7T1C structure illustrated in FIG. 6.

FIG. 20 illustrates a driving timing diagram in a case in which each of the subpixels SP in the display panel PNL according to exemplary aspects has the 7T1C structure illustrated in FIG. 6. FIGS. 21, 22, and 23 illustrate operations of each of the subpixels SP according to the driving timing in a case in which each of the subpixels SP in the display panel PNL according to exemplary aspects has the 7T1C structure illustrated in FIG. 6. FIG. 24 illustrates a driving timing diagram according to the independent gate driving a case in which each of the subpixels SP in the display panel PNL according to exemplary aspects has the 7T1C structure illustrated in FIG. 6.

When the independent gate driving mode (i.e. overall or partial independent gate driving mode) is used, in FIGS. 20 to 23, first-type scanning signals SCAN[N−1] and SCAN[N] may include SCAN[N−1]_O, SCAN[N]_O, SCAN[N−1]_E, and SCAN[N]_E illustrated in FIGS. 18 and 19.

When overall independent gate driving mode is used, in FIGS. 20 to 23, a second-type scanning signal EM may include EM_O and EM_E illustrated in FIG. 18.

When the partial independent gate driving mode is used, in FIGS. 20 to 23, the second-type scanning signal EM may be EM illustrated in FIG. 19.

Referring to FIG. 20, regardless of the odd-numbered subpixel ODD SP or the even-numbered subpixel EVEN SP, the driving period of each of the subpixels SP may include an initialization period S10, a writing/sensing period S20, an emission period S33, and the like.

Referring to FIGS. 20 and 21, in the initialization period S10, among the first-type scanning signals SCAN[N−1] and SCAN[N] and the second-type scanning signal EM, only the first-type scanning signal SCAN[N−1] has a turn-on level voltage.

Thus, during the initialization period S10, the fifth transistor T5 is turned on, while the remaining transistors DT, T1, T2, T3, T4, and T6 are in the off state.

Accordingly, an initialization voltage Vini is applied to the second node n2.

That is, the gate electrode of the driving transistor DT is initialized to the initialization voltage Vini.

Referring to FIGS. 20 and 22, in the writing/sensing period S20, among the first-type scanning signals SCAN[N−1] and SCAN[N] and the second-type scanning signal EM, only the first-type scanning signal SCAN[N] has a turn-on level voltage.

Thus, during the writing/sensing period S20, the first, second and sixth transistors T1, T2, and T6 are turned on, while the remaining transistors T3, T4, and T5 are in the off state.

During the writing/sensing period S20, the initialization voltage Vini may be applied to the anode of the organic light-emitting diode OLED corresponding to the fourth node n4, in response to the sixth transistor T6 being turned on.

In addition, during the writing/sensing period S20, the gate electrode and the drain electrode of the driving transistor DT may be electrically connected to each other, in response to the first transistor T1 being turned on. This state of the driving transistor DT is also referred to as a diode connection state.

During the writing/sensing period S20, the driving transistor DT acts as a diode, due to the diode connection.

In response to the second transistor T2 being turned on, a data voltage Vdata that has been applied to the source electrode of the driving transistor DT is transferred to the gate electrode, due to the diode connection.

Consequently, the gate electrode (corresponding to n2) of the driving transistor DT has a data voltage Vdata−|Vth|, the threshold voltage Vth of which is compensated.

Here, since the driving transistor DT is a p-type transistor, the threshold voltage Vth of the driving transistor DT may have a negative value.

Accordingly, the voltage of the gate electrode (corresponding to n2) of the driving transistor DT is Vdata+Vth (=Vdata−|Vth|=Vdata−(−Vth)=Vdata+Vth).

Referring to FIGS. 20 and 23, during the emission period S30, among the first-type scanning signals SCAN[N−1] and SCAN[N] and the second-type scanning signal EM, only the second-type scanning signal EM has a turn-on level voltage.

Thus, during the emission period S30, the third and fourth transistors T3 and T4 are turned on. In addition, the driving transistor DT is in the turned-on state. The remaining transistors T1, T2, T5, and T6 are in the off state.

Due to the third transistor T3, and driving transistor DT, and the fourth transistor T4 in the turned-on state, a driving current path from the driving voltage line DVL to the organic light-emitting diode OLED is created. Consequently, the organic light-emitting diode OLED emits light.

As illustrated in FIG. 20, when the non-independent gate driving mode is used during the initialization period S10, the length of time of the initialization period S10 is T1, and the length of time of the writing/sensing period S20 is Tws.

However, as illustrated in FIG. 24, when the independent gate driving mode is used during the initialization period S10, the display device performs the independent gate driving on the odd-numbered subpixels ODD SP and the even-numbered subpixels EVEN SP independently of each other. Thus, the length of time of the initialization period S10 of the odd-numbered subpixels ODD SP and the length of time of the initialization period S10 of the even-numbered subpixels EVEN SP can be further increased.

That is, according to the independent gate driving mode, the length of time of the initialization period S10 of each of the odd-numbered subpixels ODD SP and the even-numbered subpixels EVEN SP may be T1', longer than the initialization time T1 according to the non-independent gate driving.

In addition, when the independent gate driving mode is used during the writing/sensing period S20, the display device performs the gate driving on the odd-numbered subpixels ODD SP and the even-numbered subpixels EVEN SP independently of each other. Thus, the length of time of the writing/sensing period S20 of the odd-numbered subpixels ODD SP and the length of time of the writing/sensing period S20 of the even-numbered subpixels EVEN SP can be further increased.

That is, according to the independent gate driving mode, the length of time of the writing/sensing period S20 of each of the odd-numbered subpixels ODD SP and the even-numbered subpixels EVEN SP may be Tws', which is longer than the writing/sensing time (Vth compensation time) Tws according to the non-independent gate driving.

Accordingly, even in the case that the display panel PNL has at least one of a larger area or higher resolution, the insufficiency of the charging time and the characteristics compensation time can be reduced, and consequently, more accurate compensation and improved image quality can be provided.

As set forth above, according to exemplary aspects, the display panel PNL and the display device may have a gate driving structure (or a scanning signal transferring structure) able to increase the aperture ratio of the display panel PNL.

According to exemplary aspects, the display panel PNL and the display device may have a gate driving structure (or a scanning signal transferring structure) able to increase the aperture ratio of the display panel PNL without increasing the size of the non-active area N/A corresponding to the bezel area in a case in which the gate driver has a GIP structure.

According to exemplary aspects, the display panel PNL and the display device may have a gate driving method able to reduce or remove the insufficiency of a charging time or a characteristics compensation time and a gate driving structure (or a scanning signal transferring structure) for the gate driving method.

According to exemplary aspects, the display panel PNL and the display device may have a gate driving method and a gate driving structure (or a scanning signal transferring structure) for the gate driving method. The gate driving method can reduce or remove the insufficiency of the charging time or the characteristics compensation time while increasing the aperture ratio of the display panel, even in the case that the display panel PNL has a larger area or higher resolution.

The foregoing descriptions and the accompanying drawings have been presented in order to explain certain principles of the present disclosure by way of example. A person having ordinary skill in the art to which the present disclosure relates could make various modifications and variations by combining, dividing, substituting for, or changing the elements without departing from the principle of the present disclosure. The foregoing aspects disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. A display device comprising:
    a display panel in which a plurality of subpixels are disposed, wherein the plurality of subpixels include a first subpixel, a second subpixel, a third subpixel, and a fourth subpixel that are sequentially disposed in a single row or column;
    a gate driver disposed on the display panel and supplying a scanning signal to the plurality of subpixels;
    a first island pattern disposed in each area of the first subpixel and the third subpixel;
    a second island pattern disposed in each area of the second subpixel and the fourth subpixel;
    a first connection line electrically connecting the first island pattern disposed in the area of the first subpixel and the first island pattern disposed in the area of the third subpixel; and
    a second connection line electrically connecting second island pattern disposed in the area of the second subpixel and the second island pattern disposed in the area of the fourth subpixel,
    wherein the first connection line and the second connection line are electrically disconnected from each other, and the gate driver independently drives the first connection line and the second connection line,
    wherein a portion of the first connection line is electrically connected to the first island pattern disposed in the area of the first subpixel through a first contact hole,
    another portion of the first connection line is electrically connected to the first island pattern disposed in the area of the third subpixel through another first contact hole,
    a portion of the second connection line is electrically connected to the second island pattern disposed in the area of the second subpixel through a second contact hole,
    another portion of the second connection line is electrically connected to the second island pattern disposed in the area of the fourth subpixel through another second contact hole, and
    a number of layers, through which each of the first contact holes extends, is different from a number of layers, through which each of the second contact holes extends.

2. The display device according to claim 1, further comprising an active layer on the display panel,
    wherein the first connection line overlaps a shield pattern located between the first connection line and the active layer in an area where the first connection line overlaps the active layer, and
    wherein the second connection line overlaps the shield pattern located between the second connection line and the active layer in an area where the second connection line overlaps the active layer.

3. The display device according to claim 2, wherein the shield pattern comprises at least one of a gate material layer of which the first island pattern and the second island pattern are made, or a metal layer different from the gate material layer.

4. The display device according to claim 3, wherein the shield pattern is electrically disconnected from the first island pattern and the second island pattern.

5. The display device according to claim 1, wherein the first connection line is disposed to bypass a contact hole connecting the second connection line and the second island pattern with the second connection line located in a layer positioned above the first connection line.

6. The display device according to claim 1, wherein the second connection line is disposed to bypass a contact hole connecting the first connection line and the first island pattern with the first connection line located in a layer positioned above the second connection line.

7. The display device according to claim 1, wherein a distance between a layer in which the first connection line is located and a layer in which the first island pattern is located is shorter than a distance between a layer in which the second connection line is located and a layer in which the second island pattern is located, and
the first connection line is disposed to bypass the second contact holes.

8. The display device according to claim 1, wherein the first island pattern and the second island pattern are located in a single layer.

9. The display device according to claim 8, wherein the display panel comprises an active layer,
wherein the layer in which the first island pattern and the second island pattern are located is positioned above the active layer,
the layer in which the first connection line is located is positioned above the layer in which the first island pattern and the second island pattern are located, and
the layer in which the second connection line is located is positioned above the layer in which the first connection line is located.

10. The display device according to claim 1, wherein the first island pattern and the second island pattern are located in different layers.

11. The display device according to claim 1, wherein each of the plurality of subpixels comprises a scanning transistor,
wherein the scanning transistors included in the first subpixel and the third subpixel, operate independently of the scanning transistors included in the second subpixel and the fourth subpixel,
the first connection line is electrically connected to the scanning transistors included in the first subpixel and the third subpixel,
the first connection line is electrically disconnected from the scanning transistors included in the second subpixel and the fourth subpixel,
the second connection line is electrically connected to the scanning transistors included in the second subpixel and the fourth subpixel,
the second connection line is electrically disconnected from the scanning transistors included in the first subpixel and the third subpixel.

12. The display device according to claim 1, wherein each of the plurality of subpixel s comprises:

one or more first type transistors performing on-off operations in response to a first type gate signal corresponding to the scanning signal; and
one or more second type transistors performing on-off operations in response to a second type gate signal corresponding to an emission control signal,
wherein the one or more first type transistors included in the first subpixel and the third subpixel, operate independently of the one or more first type transistors included in the second subpixel and the fourth subpixel, and
the one or more second type transistors included in the first subpixel and the third subpixel, operate independently of the one or more second type transistors included in the second subpixel and the fourth subpixel.

13. The display device according to claim 1, wherein each of the plurality of subpixel s comprises:
one or more first type transistors performing on-off operations in response to a first type gate signal corresponding to the scanning signal; and
one or more second type transistors performing on-off operations in response to a second type gate signal corresponding to an emission control signal,
wherein the one or more first type transistors included in the first subpixel and the third subpixel, operate independently of the one or more first type transistors included in the second subpixel and the fourth subpixel, and
the one or more second type transistors, included the first subpixel and the third subpixel, operate in the same manner as the one or more second type transistors included in the second subpixel and the fourth subpixel.

14. A display device comprising:
a display panel in which a plurality of subpixels are disposed, wherein the plurality of subpixels include a first subpixel, a second subpixel, a third subpixel, and a fourth subpixel that are sequentially disposed in a single row or column;
a gate driver disposed on the display panel and supplying a scanning signal to the plurality of subpixels;
a first island pattern disposed in each area of the first subpixel and the third subpixel;
a second island pattern disposed in each area of the second subpixel and the fourth subpixel;
a first connection line electrically connecting the first island pattern disposed in the area of the first subpixel and the first island pattern disposed in the area of the third subpixel; and
a second connection line electrically connecting second island pattern disposed in the area of the second subpixel and the second island pattern disposed in the area of the fourth subpixel,
wherein the first connection line and the second connection line are electrically disconnected from each other, and the gate driver independently drives the first connection line and the second connection line,
wherein the first island pattern and the second island pattern are located in different layers,
wherein the display panel comprises an active layer, and
wherein the active layer is located between the layer in which the first island pattern is located and the layer in which the second island pattern is located.

15. The display device according to claim 14, wherein the layer in which the first island pattern is located is positioned below the active layer, the layer in which the first connection line is located is positioned below the layer in which the first island pattern is located, the layer in which the second island pattern is located is positioned above the active layer, and the layer in which the second connection line is located is positioned above the layer in which the second island pattern is located.

16. The display device according to claim 14, wherein the display panel further comprising:
   a first scanning signal transferring line, through which a first scanning signal is transferred to the first subpixel and the third subpixel; and
   a second scanning signal transferring line, through which a second scanning signal is transferred to the second subpixel and the fourth subpixel,
   wherein the first scanning signal transferring line and the second scanning signal transferring line are disposed in different layers.

17. The display panel according to claim 16, wherein each of the first to fourth subpixels comprises a scanning transistor,
   the first scanning signal transferring line is electrically connected to the scanning transistors included in the first subpixel and the third subpixel,
   the first scanning signal transferring line is electrically disconnected from the scanning transistors included in the second subpixel and the fourth subpixel,
   the second scanning signal transferring line is electrically connected to the scanning transistors included in the second subpixel and the fourth subpixel,
   the second scanning signal transferring line is electrically disconnected from the scanning transistors included in the first subpixel and the third subpixel.

18. The display panel according to claim 16, wherein the first scanning signal transferring line comprises:
   a first island pattern disposed in each area of the first subpixel and the third subpixel; and
   a first connection line electrically connecting an element of the first island pattern disposed in the area of the first subpixel and an element of the first island pattern disposed in the area of the third subpixel, and
   the second scanning signal transferring line comprises:
   a second island pattern disposed in each area of the second subpixel and the fourth subpixel;
   a second connection line electrically connecting an element of the second island pattern disposed in the area of the second subpixel and an element of the second island pattern disposed in the area of the fourth subpixel,
   the first connection line and the second connection line being electrically disconnected from each other.

* * * * *